(12) United States Patent
Yamaguchi

(10) Patent No.: US 8,334,710 B2
(45) Date of Patent: Dec. 18, 2012

(54) LEVEL CONVERSION CIRCUIT

(75) Inventor: Kouichiro Yamaguchi, Osaka (JP)

(73) Assignee: Icom Incorporated, Osaka (JP)

( * ) Notice: Subject to any disclaimer, the term of this patent is extended or adjusted under 35 U.S.C. 154(b) by 168 days.

(21) Appl. No.: 13/033,901

(22) Filed: Feb. 24, 2011

(65) Prior Publication Data

US 2011/0204921 A1 Aug. 25, 2011

(30) Foreign Application Priority Data

Feb. 25, 2010 (JP) ................. 2010-040991

(51) Int. Cl.
 *H03K 19/0175* (2006.01)

(52) U.S. Cl. ............... 326/81; 326/68; 326/83

(58) Field of Classification Search .......... 326/63, 326/68, 80–83; 327/108–109, 333
See application file for complete search history.

(56) References Cited

U.S. PATENT DOCUMENTS

| | | | |
|---|---|---|---|
| 2002/0105370 A1* | 8/2002 | Ho | 327/333 |
| 2005/0270066 A1* | 12/2005 | Kozawa | 326/81 |
| 2006/0033530 A1* | 2/2006 | Seo | 326/81 |
| 2010/0118022 A1* | 5/2010 | Kim | 345/213 |

FOREIGN PATENT DOCUMENTS

JP 2009-022054 1/2009

* cited by examiner

*Primary Examiner* — Jason M Crawford
(74) *Attorney, Agent, or Firm* — Baker & Mckenzie, LLP

(57) ABSTRACT

Circuit blocks and respectively convert high-voltage logic signals in which two logical values are expressed by a first signal potential and a second signal potential into low-voltage logic signals in which the two logical values are expressed by a third signal potential at least as large as the first signal potential and a fourth signal potential that is the third signal potential to which a positive voltage has been added and which is no greater than the second signal potential, and outputs the converted logic signals. The transistors in the circuit block are of the form of replacing the respective transistors of the circuit block with elements of opposite polarity, so that when the third signal potential is changed and operation of one of the circuit blocks and becomes difficult, the other operates normally. Consequently, stable level conversion can be accomplished.

12 Claims, 9 Drawing Sheets

US 8,334,710 B2

LEVEL CONVERSION CIRCUIT

CROSS-REFERENCE TO RELATED APPLICATION

This application claims the benefit of Japanese Patent Application No. 2010-40991, filed on Feb. 25, 2010, the entire disclosure of which is incorporated by reference herein.

FIELD OF THE INVENTION

This application relates generally to a level conversion circuit.

RELATED ART

In logic circuits, even when there is a common standard ground potential, there are times when the same logical value is expressed by locally differing fixed potentials. When two such logic circuits are connected to each other, a level converter is necessary to convert the level of the potential of the logic signals so that signaling of the logical value through transmission of a logic signal is accomplished correctly.

For example, when the output of a logic circuit expressing the logical values 0/1 by 0V/1.8V is input into a logic circuit expressing the logical values 0/1 by 0V/5V, it is necessary to connect between these two logic circuits with a level converter for converting the potential expressing the logical value 1 from 1.8V to 5V.

By providing this kind of level converter, it is possible to integrate the logic of these. Conventionally, a level converter has been designed for such applications. See, for example, Unexamined Japanese Patent Application KOKAI Publication No. 2009-22054

For example, a level converter for converting a low-voltage logic signal to a high-voltage logic signal is comprised as shown in FIG. 8.

A power source SRC1 is a power source for setting a potential LV, and a power source SRC2 is a power source for setting a potential HV, these potentials being such that $0 < LV < HV$.

This level converter is one example of a level converter for converting a low-voltage logic signal expressing the logical values 1, 0 through the electric potential LV and the standard ground potential 0V into a high-voltage logic signal expressing the logical values 1, 0 through the potential HV, which is higher than the potential LV, and the standard ground potential 0V.

This level converter is composed of circuit blocks 201 to 203, and these circuit blocks are composed of transistors X1 to X10. The transistors X1, X3, X5, X7 and X9 are PMOS (Positive-channel Metal-Oxide Semiconductor) transistors, and the transistors X2, X4, X6, X8 and X10 are NMOS (Negative-channel Metal-Oxide Semiconductor) transistors.

The transistors X1 to X4 are low-voltage transistors having a maximum drain to source voltage of at least the value LV, and the transistors X5 to X10 are high-voltage transistors having a maximum drain to source voltage of at least the value HV.

The transistor X6 and the transistor X8 are transistors having the same operating properties, that is to say having the same parameters, and the transistor X5 and the transistor X7 are transistors having the same parameters.

The circuit block 201 is a circuit block that generates a logic signal A reversing the logic signal supplied to the input terminal Pin, and a logic signal rA inverting this logic signal A. Furthermore, the circuit block 201 supplies the generated logic signal A and logic signal rA to the circuit block 202. In addition, the circuit block 201 strengthens the fan-out of the input logic signal to the circuit block 202.

The circuit block 202 is a circuit block for converting the level of the maximum voltage of the logic signal A and the logic signal rA from the low potential LV to the high potential HV. A logic signal A having a voltage of 0V or LV is applied to the gate of the transistor X6 and the logic signal rA is applied to the gate of the transistor X8.

When the potential LV is sufficiently larger than a threshold voltage $V_{TN}$ of the high-voltage NMOS transistors X6 and X8, the transistors X6 and X8 are in a state (ON, OFF) or (OFF, ON), respectively, in accordance with the value of the logic signal A.

The transistor X5 is turned ON or OFF simultaneously with the transistor X8, and the transistor X7 is turned ON or OFF simultaneously with the transistor X6. As a result, the drain voltage of the transistor X6 and the drain voltage of the transistor X8 switch between 0V/HV, and a high-voltage logic signal in which 0, 1 are expressed by the potential 0V and the high potential HV is obtained as the output signal.

The circuit block 203 is composed of the transistors X9 and X10. The circuit block 203 is a circuit for strengthening the fan-out and shaping the waveform of the output signal from the circuit block 202, and the level converter outputs the pulse waveform output signal to the output terminal Pout.

A level converter for converting a high-voltage logic signal into a low-voltage logic signal is shown in FIG. 9, for example.

This level converter is composed of transistors X21 to X24. The transistors X21 and X23 are high-voltage PMOS transistors, and the transistors X22 and X24 are high-voltage NMOS transistors.

An inverter is composed of the transistor X21 and the transistor X22, and an inverter is composed of the transistor X23 and the transistor X24.

The inverter composed by the transistor X21 and the transistor X22 is driven by the power source SRC2 of output voltage HV, and acts as a buffer for strengthening the fan-out of an input high-voltage signal.

The inverter composed by the transistor X23 and the transistor X24 is driven by the power source SRC1 of output voltage LV and switches the output voltage of the signal output from the output terminal Pout between 0V/LV.

Normally, the bulk potential of the transistor X23, which is a high-voltage PMOS transistor, needs to be fixed at the highest potential HV in the circuits of this level converter. Consequently, the transistor X23 is connected as shown in FIG. 9.

As the minimum signal level input into the inverter composed of the transistor X23 and the transistor X24 is 0V, when the threshold voltage $V_{TN}$ of the transistor X23 is not less than −LV, the high-voltage input signal is inverted and output from the output terminal Pout as a low-voltage logic signal.

When the difference between the potential HV and the potential LV is not very large, it is possible to convert a high-voltage logic signal in which 1, 0 are expressed by the potential 0V and the potential HV into a low-voltage logic signal in which 1, 0 are expressed by the potential 0V and the potential LV, using the level converter circuit shown in FIG. 9.

Among semiconductor manufacturing processes, there is a high-voltage semiconductor process which is developed particularly for fabricating a high-voltage integrated circuit for processing high-voltage signals. A high-voltage integrated circuit is often composed of both high-voltage transistors and low-voltage transistors.

In some high-voltage semiconductor processes, a low-voltage signal processing circuit layer can be fabricated inside the high-voltage integrated circuit layer, and it is possible to make the ground potential of the low-voltage circuit differ from the ground potential of the high-voltage signal processing circuit. Furthermore, it is often possible to cause the potential difference between the ground potential of the low-voltage circuit and the ground potential of the high-voltage circuit to change quasi-statically.

For example, taking the ground potential of the high-voltage signal processing circuit to be 0V, the rated voltage of the high-voltage transistor to be HV, the ground potential of the low-voltage signal processing circuit to be VG and the rated voltage of the low-voltage transistor to be LL, it is possible with the low-voltage transistor circuit to handle voltage signals in the range from at least VG to no more than VG+LL. However, the value VG+LL must be no greater than HV, and VG must be 0V or greater.

Furthermore, in the high-voltage semiconductor process, by causing the aforementioned ground potential VG of the low-voltage signal processing circuit to change quasi-statically, a high-voltage signal no less than 0V and no greater than HV can be handled by the low-voltage signal processing circuit.

In general, a high-voltage signal processing circuit has slow operation and occupies a large area on an integrated circuit (specifically, the layout pattern thereof). On the other hand, a low-voltage signal processing circuit has high-speed operation and occupies a smaller area. Consequently, in some types of devices, it is possible to increase performance and reduce area by replacing the high-voltage signal processing circuit with a low-voltage signal processing circuit having the above-described variable ground potential.

One high-voltage integrated circuit of this kind is a high-voltage PLL circuit disclosed in Unexamined Japanese Patent Application KOKAI Publication No. 2010-245879. This publication was published after the basic Japanese Patent Application No. 2010-40991 was filed with the Japan Patent Office. In this high-voltage integrated circuit, a high-voltage signal processing circuit and a low-voltage signal processing circuit are provided inside.

This low-voltage signal processing circuit handles low-voltage logic signals in which the logical values 0, 1 are expressed by the potential VG that is a variable ground potential and a potential (VG+LL) that is the positive fixed voltage LL added to the potential VG. This low-voltage signal processing circuit is composed of a logic circuit that serves the functions of control and interface, and an analog signal processing circuit that handles analog voltage signals in the range of not less than VG to not greater than VG+LL. The relationship among these potentials is 0≦VG≦VG+LL≦HV.

In order to control this kind of high-voltage integrated circuit, a controlling logic circuit such as a microcontroller, for example, is provided externally to this high-voltage integrated circuit. Furthermore, sending and receiving of commands and data through binary logic signals is accomplished between this controlling logic circuit and the internal logic circuits inside the low-voltage signal processing circuit having a variable ground potential installed inside the high-voltage integrated circuit.

In this case, the external controlling logic circuit handles binary logic signals in which 0, 1 are normally expressed by a standard ground potential 0V and a low fixed potential LV, where 0<LV<HV. Consequently, in order to send and receive commands and data between the external controlling logic circuit and the internal logic circuit, a level converter satisfying the functions below is necessary.

(1) A level conversion function necessary for data reception by the internal logic circuit of the integrated circuit. That is to say, a function of converting low-voltage logic signals in which 0, 1 are expressed by a standard ground potential 0V and a potential LV into low-voltage logic signals in which 0, 1 are expressed by a variable ground potential VG and a potential VG+LL.

(2) A level conversion function necessary for data transmission by the internal logic circuit of the integrated circuit. That is to say, a function for converting low-voltage logic signals in which 0, 1 are expressed by a variable ground potential VG and a potential VG+LL into low-voltage logic signals in which 0, 1 are expressed by a standard ground potential 0V and a potential LV.

Furthermore, this level converter must have the following specifications.

(3) Normal operation must be realized even when the above-described functions (1) and (2) have caused the variable ground potential VG to change between the standard ground potential 0V and a potential HV−LL.

(4) The above-described functions (1) and (2) are normally realized and the specification of (3) is satisfied even when the potential HV is set lower than the rated voltage of the high-voltage transistor in order to conserve power.

However, even if a level converter satisfying the above-described conditions (1) through (4) is realized using a conventional level converter such as those shown in FIG. 8 and FIG. 9, the threshold voltage of the transistor may be influenced by the source-base voltage, depending on the various potential settings.

The relationship between this threshold voltage and the source-base voltage is expressed as the so-called body effect. When this body effect markedly occurs, the switching operation becomes difficult and level conversion may give incorrect outputs.

SUMMARY

In consideration of the foregoing, it is an object of the present invention to provide a level conversion circuit capable of accomplishing stable level conversion.

In order to realize the above objectives, the level conversion circuit according to a first aspect of the present invention is a level conversion circuit that converts and outputs the potential of a logic signal, having:

a first circuit block composed of semiconductor elements and including a first signal input terminal, a first voltage terminal and a second voltage terminal, which when a first high-voltage logic signal in which two logical values are expressed by a first signal potential and a second signal potential is input into the first signal input terminal, converts the first high-voltage logic signal into a first low-voltage logic signal in which the two logical values are expressed by a third signal potential that is equal to or greater than the first signal potential, and a fourth signal potential that is greater than the third signal potential and is not greater than the second signal potential; and a second circuit block composed of semiconductor elements of opposite polarity to the first circuit block and including a second signal input terminal, a third voltage terminal and a fourth voltage terminal, which when the first high-voltage logic signal is input into the second signal input terminal, converts the first high-voltage logic signal into a low-voltage second logic signal in which the two logical values are expressed by the third signal potential and the fourth signal potential;

wherein the first signal input terminal and the second signal input terminal are connected to each other;

the third signal potential is applied to the first voltage terminal and the third voltage terminal;

the fourth signal potential is applied to the second voltage terminal and the fourth voltage terminal; and the second logic signal is output from either the first circuit block or the second circuit block, depending on the value of the third signal potential.

The level conversion circuit may further have a third circuit block that converts a third logic signal in which the two logical values are expressed by the first signal potential and a fifth signal potential higher than the first signal potential yet lower than the second signal potential into the first logic signal and supplies this first logic signal to the first circuit block and the second circuit block.

The level conversion circuit may be such that:

the first circuit block has:

an N-channel switch circuit composed of N-channel semiconductor elements and including a first signal input terminal, a first voltage terminal, a first connection terminal and a second connection terminal, such that when the bulk potential of the N-channel semiconductor elements is held at the first signal potential and the voltage of the first signal potential is applied to the first signal input terminal, the first voltage terminal and the first connection terminal are shorted each other and the second connection terminal is open, and when the voltage of the second signal potential applied to the first signal input terminal, the first voltage terminal and the second connection terminal are shorted each other and the first connection terminal is open; and a P-channel load circuit including a second voltage terminal, a third connection terminal and a fourth connection terminal, such that when one out of the third and fourth connection terminals is open and a voltage that is at least a fixed amount less than the potential of the second voltage terminal is applied to the other of the connection terminals, the potential of the connection terminal in the open state is equal to the potential of the second voltage terminal;

the second circuit block has:

a P-channel switch circuit composed of P-channel semiconductor elements and including a second signal input terminal, a third voltage terminal, a fifth connection terminal and a sixth connection terminal, such that when the bulk potential of the P-channel semiconductor elements is held at a potential higher than the fourth signal potential and the voltage of the first signal potential is applied to the second signal input terminal, the third voltage terminal and the fifth connection terminal are shorted each other and the sixth connection terminal is open, and when the voltage of the second signal potential is applied to the second signal input terminal, the third voltage terminal and the sixth connection terminal are shorted each other and the fifth connection terminal is open; and an N-channel load circuit including a fourth voltage terminal, a seventh connection terminal and an eighth connection terminal, such that when one out of the seventh and eighth connection terminals is open and a voltage that is at least a fixed amount higher than the potential of the fourth voltage terminal is applied to the other of the connection terminals, the potential of the connection terminal in the open state is equal to the potential of the fourth voltage terminal;

the third connection terminal and the first connection terminal are connected by a first node;

the fourth connection terminal and the second connection terminal are connected by a second node;

the seventh connection terminal and the fifth connection terminal are connected by a third node;

the eighth connection terminal and the sixth connection terminal are connected by a fourth node;

the first node and the fourth node are connected to each other;

the second node and the third node are connected to each other;

the first logic signal is input into both the first and second signal input terminals; and the second logic signal is output from either the first node or the second node.

The level conversion circuit may be composed such that:

the first circuit block has a first transistor, a second transistor, a third transistor and a fourth transistor as transistors having current paths and control terminals, wherein:

the fourth signal potential is applied to one end of the current path and the bulk of the first transistor, and to one end of the current path and the bulk of the third transistor;

the other end of the current path of the first transistor is connected to one end of the current path of the second transistor;

the other end of the current path of the third transistor is connected to one end of the current path of the fourth transistor;

the third signal potential is applied to the other end of the current path of the second transistor and the other end of the fourth transistor;

the first signal potential is applied to the bulk of the second transistor and the bulk of the fourth transistor; and the connection point between the other end of the current path of the first transistor and the one end of the current path of the second transistor is called a first node, and the connection point between the other end of the current path of the third transistor and the one end of the current path of the fourth transistor is called a second node, the control terminal of the first transistor is connected to the second node and the control terminal of the third transistor is connected to the first node;

the second circuit block has a fifth transistor, a sixth transistor, a seventh transistor and an eighth transistor as transistors having current paths and control terminals, wherein:

the fourth signal potential is applied to one end of the current path of the fifth transistor and to one end of the current path of the seventh transistor;

the second signal potential is applied to the bulk of the fifth transistor and to the bulk of the seventh transistor;

the other end of the current path of the fifth transistor is connected to one end of the current path of the sixth transistor;

the other end of the current path of the seventh transistor is connected to one end of the current path of the eighth transistor;

the third signal potential is applied to the other end of the current path of the sixth transistor and the other end of the eighth transistor; and the connection point between the other end of the current path of the fifth transistor and the one end of the current path of the sixth transistor is called a third node, and the connection point between the other end of the current path of the seventh transistor and the one end of the current path of the eighth transistor is called a fourth node, the control terminal of the sixth transistor is connected to the fourth node and the control terminal of the eighth transistor is connected to the third node;

the first node of the first circuit block and the third node of the second circuit block are connected, and the second node of the first circuit block and the fourth node of the second circuit block are connected;

the control terminal of the second transistor and the control terminal of the fifth transistor are connected, and the control terminal of the fourth transistor and the control terminal of the seventh transistor are connected; and the first signal potential or the second signal potential is applied to the connection point between the control terminal of the second transistor and the control terminal of the fifth transistor, and to the connection point between the control terminal of the fourth transistor and the control terminal of the seventh transistor, and the second logic signal at the third signal potential or the fourth signal potential is output from the first node and the third node, or from the second node and the fourth node.

The level conversion circuit may have a composition such that the first transistor, the third transistor, the fifth transistor and the seventh transistor are composed of PMOS transistors, and the second transistor, the fourth transistor, the sixth transistor and the eighth transistor are composed of NMOS transistors.

The level conversion circuit may have a composition such that the first transistor and the third transistor are elements having substantially identical properties, and the fifth transistor and the seventh transistor are elements having substantially identical properties.

In addition, the level conversion circuit may further have a fourth circuit block that converts the second logic signal into a fourth logic signal in which the two logical values are expressed by the first signal potential and the fourth signal potential;

wherein the fourth circuit block is provided with a ninth transistor, a tenth transistor, an eleventh transistor, a twelfth transistor, a thirteenth transistor and a fourteenth transistor as transistors having current paths and control terminals, such that:

the fourth signal potential is applied to one end of the current path and the bulk of the ninth transistor;

one end of the current path of the tenth transistor is connected to the other end of the current path of the ninth transistor, and the third signal potential is applied to the other end and the bulk of the tenth transistor;

the control terminal of the ninth transistor, the control terminal of the tenth transistor and the control terminal of the eleventh transistor are connected;

the fourth signal potential is applied to one end of the current path of the eleventh transistor and one end of the current path of the twelfth transistor;

the second signal potential is applied to the bulk of the eleventh transistor and the bulk of the twelfth transistor;

the other end of the current path of the eleventh transistor is connected to one end of the current path of the fourteenth transistor;

the other end of the current path of the twelfth transistor is connected to one end of the current path of the thirteenth transistor;

the first signal potential is applied to the other end of the current path and the bulk of the thirteenth transistor and on the other end of the current path and the bulk of the fourteenth transistor;

the control terminal of the twelfth transistor is connected to the connection point between the other end of the current path of the ninth transistor and the one end of the current path of the tenth transistor;

the connection point between the other end of the current path of the twelfth transistor and the one end of the current path of the thirteenth transistor is a fifth node, and the connection point between the other end of the current path of the eleventh transistor and the one end of the current path of the fourteenth transistor is a sixth node;

the control terminal of the thirteenth transistor is connected to the sixth node and the control terminal of the fourteenth transistor is connected to the fifth node;

the second logic signal is supplied to the connection point between the control terminal of the ninth transistor, the control terminal of the tenth transistor and the control terminal of the eleventh transistor; and the fourth logic signal at the first signal potential or the fourth signal potential is output from the fifth node or the sixth node.

The level conversion circuit may have a composition such that the ninth transistor, the eleventh transistor and the twelfth transistor are composed of PMOS transistors, and the tenth transistor, the thirteenth transistor and the fourteenth transistor are composed of NMOS transistors.

The level conversion circuit may be such that the fourth circuit block further comprises a fifteenth transistor and a sixteenth transistor as transistors provided with current paths and control terminals, wherein:

the fourth signal potential is applied to one end of the current path and the bulk of the fifteenth transistor and on one end of the current path and the bulk of the sixteenth transistor;

the other end of the current path of the fifteenth transistor is connected to one end of the current path of the twelfth transistor, and the other end of the current path of the sixteenth transistor is connected to one end of the current path of the eleventh transistor;

the third signal potential is applied to the control terminal of the eleventh transistor and the control terminal of the twelfth transistor, and the control terminal of the fifteenth transistor is connected to the connection point between the control terminal of the ninth transistor and the control terminal of the tenth transistor, and the control terminal of the sixteenth transistor is connected to the connection point between the other end of the current path of the ninth transistor and the one end of the current path of the tenth transistor.

The level conversion circuit may further have a fifth circuit block that converts the fourth logic signal into a fifth logic signal in which the two logical values are expressed by the first signal potential and the fifth signal potential;

wherein the fifth circuit block is provided with a seventeenth transistor, an eighteenth transistor, a nineteenth transistor and a twentieth transistor as transistors having current paths and control terminals, such that:

the fifth signal potential is applied to one end of the current path and the bulk of the seventeenth transistor and one end of the current path and the bulk of the nineteenth transistor;

the other end of the current path of the seventeenth transistor is connected to one end of the current path of the eighteenth current path;

the other end of the current path of the nineteenth transistor is connected to one end of the current path of the twentieth transistor;

the first signal potential is applied to the other end of the current path and the bulk of the eighteenth transistor and on the other end of the current path and the bulk of the twentieth transistor;

the connection point between the other end of the current path of the seventeenth transistor and one end of the current path of the eighteenth transistor is called a seventh node, and the connection point between the other end of the current path of the nineteenth transistor and one end of the current path of the twentieth transistor is called an eighth node;

the control terminal of the seventeenth transistor is connected to the eighth node, and the control terminal of the nineteenth transistor is connected to the seventh node;

the fourth logic signal is supplied to the control terminal of the twentieth transistor and a signal equivalent to reversing the fourth logic signal is supplied to the control terminal of the eighteenth transistor; and the fifth logic signal at the first signal potential or the fifth signal potential is output from the seventh node or the eighth node.

The level conversion circuit according to a second aspect of the present invention is a level conversion circuit that converts and outputs a second logic signal in which two logical values are expressed by a third signal potential at least as great as a first signal potential and a fourth signal potential higher than the third potential into a third logic signal in which the two logical values are expressed by the first signal potential and a fifth signal potential higher than the first signal potential, and having:

an N-channel switch circuit composed of N-channel semiconductor elements and including a first signal input terminal, a first voltage terminal, a first connection terminal and a second connection terminal, such that when the bulk potential of the N-channel semiconductor elements is held at the first signal potential and the voltage of the first signal potential is applied to the first signal input terminal, the first voltage terminal and the first connection terminal are shorted each other and the second connection terminal is open, and when the voltage of the fourth signal potential is applied to the first signal input terminal the first voltage terminal and the second connection terminal are shorted each other and the first connection terminal is open;

a P-channel switch circuit composed of P-channel semiconductor elements and including a second signal input terminal, a second voltage terminal, a third connection terminal and a fourth connection terminal, such that when the bulk potential of the P-channel semiconductor elements is held at a potential higher than the fourth signal potential and the voltage of the third signal potential is applied to the second signal input terminal the second voltage terminal and the third connection terminal are shorted each other and the fourth connection terminal is open, and when the voltage of the fourth signal potential is applied to the second signal input terminal the second voltage terminal and the fourth connection terminal are shorted each other and the third connection terminal is open;

an N-channel load circuit including a third voltage terminal, a fifth connection terminal and a sixth connection terminal, such that when one out of the fifth and sixth connection terminals is open and a voltage that is at least a fixed amount higher than the potential of the third voltage terminal is applied to the other of the connection terminals, the potential of the connection terminal in the open state is equal to the potential of the third voltage terminal; and a P-channel load circuit including a fourth voltage terminal, a seventh connection terminal and an eighth connection terminal, such that when one out of the seventh and eighth connection terminals is open and a voltage that is at least a fixed amount less than the potential of the fourth voltage terminal is applied to the other of the connection terminals, the potential of the connection terminal in the open state is equal to the potential of the fourth voltage terminal;

such that the first voltage terminal and the third voltage terminal are held at the first signal potential;

the second voltage terminal is held at the fourth signal potential;

the fourth voltage terminal is held at the fifth signal potential;

the fifth connection terminal and the third connection terminal are connected by a first node;

the sixth connection terminal and the fourth connection terminal are connected by a second node;

the seventh connection terminal and the first connection terminal are connected by a third node;

the eighth connection terminal and the second connection terminal are connected by a fourth node;

the first signal input terminal and the first node are connected;

the second logic signal is input into the second signal input terminal; and the third logic signal is output from either the third node or the fourth node.

The level conversion circuit according to a third aspect of the present invention is a level conversion circuit that converts and outputs a second logic signal in which two logical values are expressed by a third signal potential at least as great as a first signal potential and a fourth signal potential higher than the third potential into a third logic signal in which the two logical values are expressed by the first signal potential and a fifth signal potential higher than the first signal potential, having:

a P-channel switch circuit composed of P-channel semiconductor elements and including a signal input terminal, a first voltage terminal, a first connection terminal and a second connection terminal, such that when the bulk potential of the P-channel semiconductor elements is held at a potential higher than the fourth signal potential and the voltage of the third signal potential is applied to the signal input terminal, the first voltage terminal and the first connection terminal are shorted each other and the second connection terminal is open, and when the voltage of the fourth signal potential is applied to the signal input terminal, the first voltage terminal and the second connection terminal are shorted each other and the first connection terminal is open;

an N-channel load circuit including a second voltage terminal, a third connection terminal and a fourth connection terminal, such that when one out of the third and fourth connection terminals is open and a voltage that is at least a fixed amount higher than the potential of the second voltage terminal is applied to the other of the connection terminals, the potential of the connection terminal in the open state is equal to the potential of the second voltage terminal; and an N-channel voltage limiting circuit composed of N-channel semiconductor elements and including a third voltage terminal, a fifth connection terminal, a sixth connection terminal, a seventh connection terminal and an eighth connection terminal, such that when the potential difference found by subtracting the potential of the seventh connection terminal from the potential of the third voltage terminal is larger than a predetermined threshold voltage, the fifth connection terminal and the seventh terminal are shorted, or are left open otherwise and when the potential difference found by subtracting the potential of the eighth connection terminal from the potential of the third voltage terminal is larger than this threshold voltage, the sixth connection terminal and the eighth connection terminal are shorted, or are left open otherwise;

wherein the first voltage terminal is held at the fourth signal potential, the second voltage terminal is held at the first signal potential, and a preset reference voltage that is a value at least as large as the fifth signal potential is applied to the third voltage terminal;

the first connection terminal and the fifth connection terminal are connected to each other;

the second connection terminal and the sixth connection terminal are connected to each other;

the third connection terminal and the seventh connection terminal are connected by a first node;

the fourth connection terminal and the eighth connection terminal are connected by a second node;

the second logic signal is input into the signal input terminal; and the third logic signal is output from either the first node or the second node.

BRIEF DESCRIPTION OF THE DRAWINGS

A more complete understanding of this application can be obtained when the following detailed description is considered in conjunction with the following drawings, in which.

DETAILED DESCRIPTION

The level converter according to the preferred embodiments of the present invention is described below with reference to the drawings.

Embodiment 1

Figure 1:
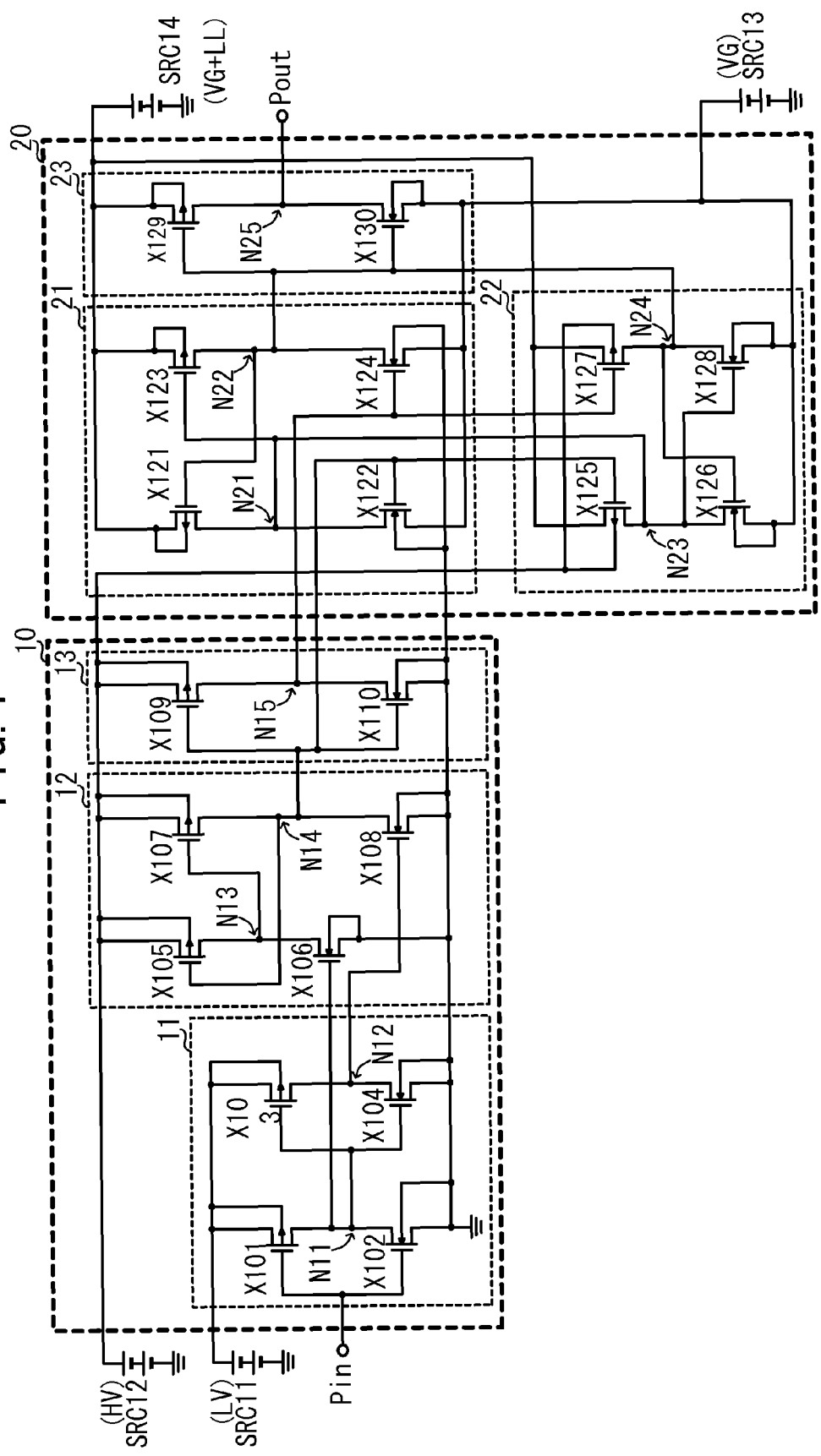
FIG. 1 is a circuit diagram showing the composition of a level converter for converting low-voltage logic signals into high-voltage logic signals according to a first embodiment of the present invention.

FIG. 1 shows the composition of a level converter according to a first embodiment.

The level converter according to the first embodiment converts a low-voltage logic signal in which two logical values 0, 1 are expressed by a standard ground potential 0V and a potential LV into a high-voltage logic signal in which the two logical values 0, 1 are expressed by a variable ground potential VG and a potential (VG+LL) obtained by adding a positive constant voltage LL to the potential VG.

This level converter is connected, for example, between a controlling logic circuit such as a microcontroller provided externally to a high-voltage integrated circuit, and an internal logic circuit (low-voltage signal processing circuit) provided internally to the high-voltage integrated circuit (neither of which is shown in the drawings).

The controlling logic circuit handles binary logic signals in which the two logical values 0, 1 are expressed by the standard ground potential 0V and a fixed potential LV lower than a potential HV. The internal logic circuit handles low-voltage logic signals in which the two logical values 0, 1 are expressed by the variable ground potential VG and the potential (VG+LL). Here, VG is 0 or greater and (VG+LL) is no greater than HV.

An input terminal Pin is connected to the controlling logic circuit, and the logic signal of the standard ground potential 0V or the potential LV is input from this controlling logic circuit. The level converter outputs to this internal logic circuit a low-voltage logic signal in which the two logical values 0, 1 are expressed by the variable ground potential VG and the potential (VG+LL), which changes in accordance with the potential VG.

The level converter according to the first embodiment is composed of circuit blocks 10 and 20. The circuit block 10 has the same composition as the conventional level converter shown in FIG. 8, and is a circuit block that converts low-voltage logic signals in which the two logical values 0, 1 are expressed by the potential 0V and the potential LV into high-voltage logic signals in which the two logical values 0, 1 are expressed by the potential 0V and the potential HV.

The circuit block 20 is a circuit block that converts high-voltage logic signals in which the two logical values 0, 1 are expressed by the potential 0V and the potential HV into low-voltage logic signals in which the two logical values 0, 1 are expressed by the potential VG and the potential (VG+LL). This circuit block 20 is further composed of circuit blocks 21, 22 and 23.

The circuit block 21 is a circuit block that converts high-voltage logic signals in which the two logical values 0, 1 are expressed by the potential 0V and the potential HV into low-voltage logic signals in which the two logical values 0, 1 are expressed by the potential VG and the potential (VG+LL). This circuit block 21 has circuit topology similar to circuit block 202 shown in FIG. 8, but differs in the below-described points.

The circuit block 22, like the circuit block 21, is a circuit block that converts high-voltage logic signals in which the two logical values 0, 1 are expressed by the potential 0V and the potential HV into low-voltage logic signals in which the two logical values 0, 1 are expressed by the potential VG and the potential (VG+LL).

This circuit block 22 has a composition in which the various transistor elements in the circuit block 21 are replaced with elements having the opposite polarity. By providing this circuit block 22, even when the operation of one of the circuit blocks 21 and 22 becomes difficult, the operation of the other remains stable. The circuit block 23 is a circuit block for shaping the waveform and strengthening output signal fan-out.

A power source SRC11 is a power source that sets the potential LV and a power source SRC12 is a power source that sets the potential HV (HV>LV). A power source SRC13 is a power source that sets the potential VG and a power source SRC14 is a power source that sets the potential (VG+LL).

As described above, the relationships among the various potentials are $0 \leq VG \leq VG+LL$ and $0 < LV < HV$. The potential VG is a potential that can be changed within the range 0≦VG≦(HV−LL). In addition, the potential HV is a constant value not greater than the rated voltage of the high-voltage transistors used, and the potential LV and the potential LL are constant values not greater than the rated voltage of the low-voltage transistors used.

The composition of the various circuit blocks 10 and 20 are described in detail below.

The circuit block 10 is composed of circuit blocks 11 to 13. The circuit block 11 is composed of transistors X101 to X104.

The transistors X101 and X103 are low-voltage PMOS transistors and the transistors X102 and X104 are low-voltage NMOS transistors.

The source and the bulk of the transistor X101 are connected to the positive terminal of the power source SRC11, and the drain of the transistor X101 and the drain of the transistor X102 are connected to each other. This connection point is called a node N11. The source and the bulk of the transistor X102 are grounded.

The source and the bulk of the transistor X103 are connected to the positive terminal of the power source SRC11, and the drain of the transistor X103 and the drain of the transistor X104 are connected to each other. This connection point is called a node N12. The source and the bulk of the transistor X104 are grounded.

The gate of the transistor X101 and the gate of the transistor X102 are connected to the input terminal Pin.

The gate of the transistor X103 and the gate of the transistor X104 are connected to the node N11.

The circuit block 12 is composed of transistors X105 to X108.

The transistors X106 and X108 are high-voltage NMOS transistors possessing mutually identical parameters. Similarly, the transistors X105 and X107 are high-voltage PMOS transistors possessing mutually identical parameters.

The source and the bulk of the transistor X105 are connected to the positive terminal of the power source SRC12, and the drain of the transistor X105 and the drain of the transistor X106 are connected to each other. This connection point is called a node N13. The source and the bulk of the transistor X106 are grounded.

The source and base of the transistor X107 are connected to the positive terminal of the power source SRC12, and the drain of the transistor X107 and the drain of the transistor X108 are connected to each other. This connection point is called a node N14. The source and the bulk of the transistor X108 are grounded.

The gate of the transistor X106 is connected to the node N11, and the gate of the transistor X108 is connected to the node N12. The gate of the transistor X105 is connected to the node N14, and the gate of the transistor X107 is connected to the node N13.

The circuit block 13 is composed of transistors X109 and X110. The transistor X109 is a high-voltage PMOS transistor, and the transistor X110 is a high-voltage NMOS transistor.

The source and the bulk of the transistor X109 are connected to the positive terminal of the power source SRC12, and the drain of the transistor X109 and the drain of the transistor X110 are connected to each other. This connection point is called a node N15. The source and the bulk of the transistor X110 are grounded. The gate of the transistor X109 and the gate of the transistor X110 are connected to the node N14.

The circuit block 21 inside the circuit block 20 is composed of transistors X121 to X124.

The transistors X122 and X124 are high-voltage NMOS transistor possessing mutually identical parameters. Similarly, the transistors X121 and X123 are low-voltage PMOS transistors possessing mutually identical parameters.

The source and the bulk of the transistor X121 are connected to the positive terminal of the power source SRC14, and the drain of the transistor X121 and the drain of the transistor X122 are connected to each other. This connection point is called a node N21. The source of the transistor X122 is connected to the positive terminal of the power source SRC13, and the bulk is grounded to 0V.

The source and the bulk of the transistor X123 are connected to the positive terminal of the power source SRC14. The drain of the transistor X123 and the drain of the transistor X124 are connected to each other. This connection point is called a node N22. The source of the transistor X124 is connected to the positive terminal of the power source SRC13, and the bulk is grounded to 0V.

The gate of the transistor X122 is connected to the node N14, and the gate of the transistor X124 is connected to the node N15. The gate of the transistor X121 is connected to the node N22, and the gate of the transistor X123 is connected to the node N21.

The circuit block 22 is composed of transistors X125 to X128. The transistors X125 and X127 are high-voltage PMOS transistors, and the transistors X126 and X128 are low-voltage NMOS transistors.

The transistors X126 and X128 are elements having mutually identical parameters. Similarly, the transistors X125 and X127 are elements having mutually identical parameters.

The source of the transistor X125 is connected to the positive terminal of the power source SRC14, and the bulk is connected to the positive terminal of the power source SRC12.

The drain of the transistor X125 and the drain of the transistor X126 are connected to each other. This connection point is called a node N23. The source and the bulk of the transistor X126 are connected to the positive terminal of the power source SRC13.

The source of the transistor X127 is connected to the positive terminal of the power source SRC14, and the bulk is connected to the positive terminal of the power source SRC12.

The drain of the transistors X127 and the drain of the transistor X128 are connected to each other. This connection point is called a node N24. The source and the bulk of the transistor X128 are connected to the positive terminal of the power source SRC13.

The node N21 of the circuit block 21 is connected to the node N23 of the circuit block 22. In other words, the node N21 and the node N23 have the same meaning but are explained as separate nodes for convenience. Similarly, the node N22 of the circuit block 21 is connected to the node N24 of the circuit block 22.

The gate of the transistor X125 is connected to the node N14, and the gate of the transistor X127 is connected to the node N15. The gate of the transistor X126 is connected to the node N24, and the gate of the transistor X128 is connected to the node N23.

The circuit block 23 is a circuit block for shaping the waveforms and strengthening the fan-out of the signals output from the circuit block 22 and the circuit block 21. The circuit block 23 is composed of transistors X129 and X130.

The transistor X129 is a low-voltage PMOS transistor, and the transistor X130 is a low-voltage NMOS transistor. The transistors X129 and X130 comprise low-voltage inverter circuits.

The source and the bulk of the transistor X129 are connected to the positive terminal of the power source SRC14, and the drain of the transistor X129 is connected to the drain of the transistor X130. This connection point is called a node N25. The node N25 is connected to the output terminal Pout. The source and the bulk of the transistor X130 are connected to the positive terminal of the power source SRC13. The gate of the transistor X129 and the gate of the transistor X130 are connected to the node N22.

The ground lines to which the sources of the transistors X126 and X128 of the circuit block 22, the sources of the transistors X122 and X124 of the circuit block 21 and the source of the transistor X130 of the circuit block 23 are connected maintain the potential VG through the power source SRC13.

In addition, the positive power source lines to which the sources of the transistors X125 and X127 of the circuit block 22, the sources of the transistors X121 and X123 of the circuit block 21 and the source of the transistor X129 of the circuit block 23 are connected maintain the potential (VG+LL) through the power source SRC14.

The output voltage VG of the power source SRC13 and the output voltage (VG+LL) of the power source SRC14 change in accordance with each other. Accordingly, the potential difference between the ground lines and the positive power sources lines in the circuit blocks 21, 22 and 23 is maintained at a constant value LL at all times, regardless of VG.

Next, the operation of the level converter according to the first embodiment is explained.

When an input signal (logic signal) of standard ground potential 0V is input to the input terminal Pin, the circuit block 10 outputs a logic signal of potential V[N14]=HV and a logic signal of potential V[N15]=0V to the circuit block 20. (Here, the notation V[α] indicates the potential of node α.)

In addition, when an input signal (logic signal) of potential LV is input to the input terminal Pin, the circuit block 10 outputs a logic signal of potential V[N14]=0V and a logic signal of potential V[N15]=HV to the circuit block 20.

When a logic signal of potential V[N14]=0V and a logic signal of potential V[N15]=HV are input to the circuit block 20, the potential V[N15]=HV is applied to the gate of the transistor X124 of the circuit block 21. Furthermore, the potential V[N14]=0V is applied to the gate of the transistor X122.

Because the source of the transistor X122 is maintained at the potential VG, the gate voltage Vgs[X122] of the transistor X122 becomes (HV−VG) when the potential V[N14]=HV (logical value 1) and becomes −VG when the potential V[N14]=0V (logical value 0).

In addition, because the source of the transistor X124 is also maintained at the potential VG, the gate voltage Vgs[X124] of the transistor X124 becomes (HV−VG) when the potential V[N15]=HV (logical value 1) and becomes −VG when the potential V[N15]=0V (logical value 0). (Here, the notation Vgs[β] indicates the gate voltage (the voltage between gate and source) of transistor β).

When the gate voltages Vgs[X122] and Vgs[X124] are sufficiently larger values than the threshold voltages $V_{TN}$ of the respective transistors, the transistor X122 and the transistor X124 switch between ON and OFF states, or OFF and ON states, respectively, in accordance with the potential of the potentials V[N14] and V[N15].

In addition, the gate of the transistor X123 is connected to the drains of the transistors X122 and X121, that is to say to the node N21. In addition, the gate of the transistor X121 is connected to the drains of the transistors X124 and X123, that is to say to the node N22. The sources of the transistors X121 and X123 are maintained at the potential (VG+LL). Consequently, when either of the transistors X122 or X124 is in an ON state and the other is in an OFF state, the transistors X121 and X124 and the transistors X123 and X122 assume an ON or OFF state synchronously.

As a result, the drain voltages of the transistor X123 and the transistor X121 switch between VG and (VG+LL), and a low-voltage output signal (logic signal) Sout in which the logical values 1, 0 are expressed by the potential VG and the potential (VG+LL) is output from the node N22.

In the circuit block 23, the low-voltage inverter comprised of the transistor X129 and the transistor X130 inverts the output signal Sout from the node N22 (N24) while shaping the waveform, and outputs the result to the output terminal Pout. Accordingly, the logic signal that appears at the output terminal Pout is a signal in which the logical values 0, 1 are expressed by the potential VG and the potential (VG+LL). This low-voltage inverter also serves the role of strengthening the fan-out of the output signal Sout.

Figure 8:
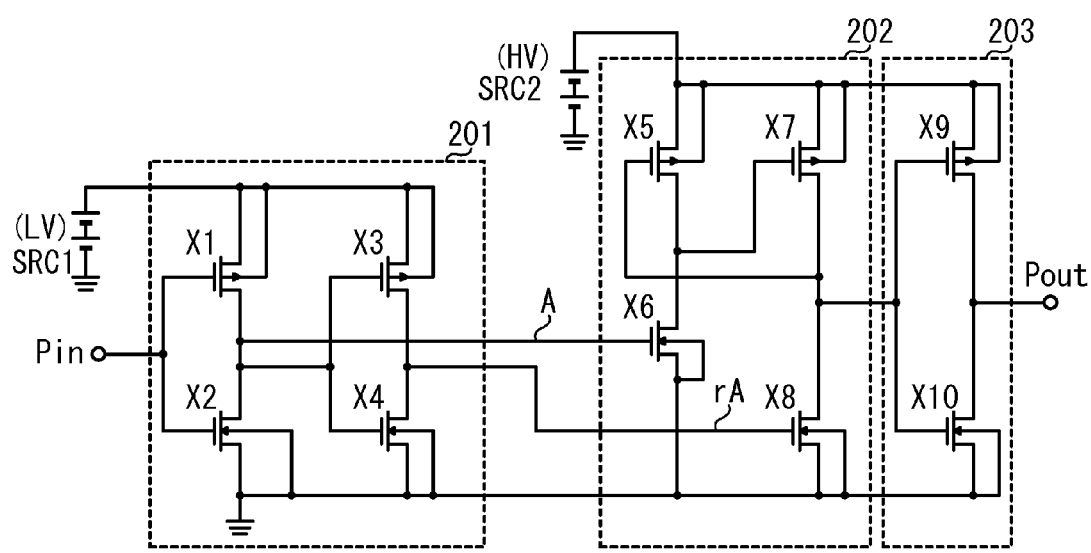
FIG. 8 is a circuit diagram showing the composition of a conventional level converter for converting low-voltage logic signals into high-voltage logic signals.
Figure 9:
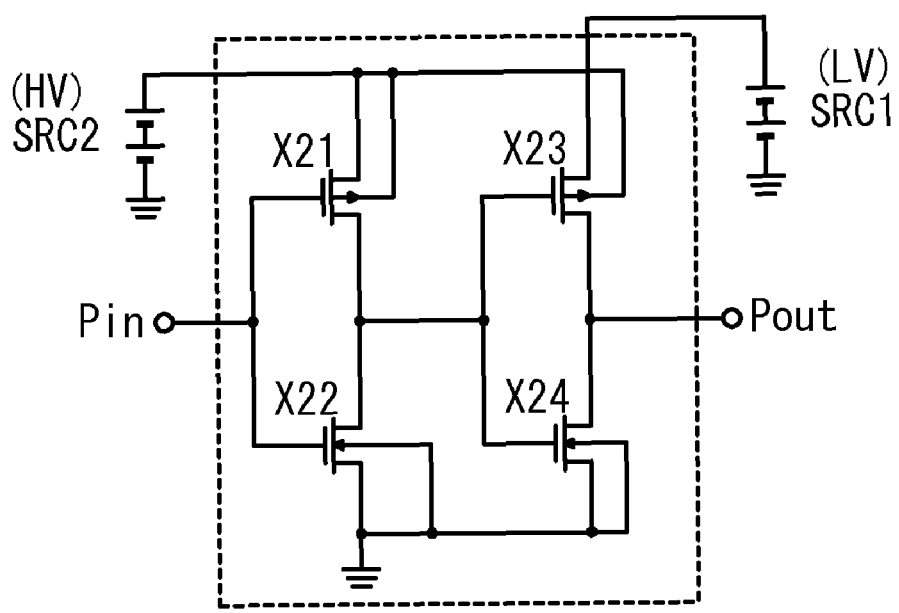
FIG. 9 is a circuit diagram showing the composition of a conventional level converter for converting high-voltage logic signals into low-voltage logic signals.

In the conventional level converter shown in FIG. 8, high-voltage PMOS transistors are used for the transistors X5 and X7 connected to the drains of the high-voltage transistors X6 and X8. In contrast, because in the first embodiment the amplitude of the output signal Sout becomes a low voltage not greater than LL, it is possible to use low-voltage PMOS transistors for the transistors X121 and X123.

In the first embodiment, depending on the case it may be possible to use high-voltage PMOS transistors for the transistors X121 and X123. However, in this case, a high-voltage transistor having a higher threshold gate-source voltage than a low-voltage transistor is caused to be switched by a low gate-source voltage with a maximum value of LL. Besides, compared to the case when the transistors X121 and X123 are used as low-voltage transistors, a high-voltage PMOS transistor that occupies an extremely large area on the integrated circuit is necessary. As a result, manufacturing costs rise and operating speed declines.

In addition, the bulk potential of the high-voltage PMOS transistor is set to the highest potential in the circuit, in other words to the potential HV. Accordingly, when the difference between the source potentials of the transistors X121 and X123 and the potential HV is large, switching is hard to occur due to the so-called body effect.

Consequently, normally it is preferable to use low-voltage PMOS transistors for the transistors X121 and X123.

The body effect is a phenomenon in which the threshold voltage $V_{TN}$ of the transistor is dependent on the source-bulk voltage $V_{SB}$. The relationship between $V_{TN}$ and $V_{SB}$ is approximated by equation (1) below.

[Formula 1]

$$V_{TN} = V_{T0} + \gamma(\sqrt{|V_{SB}| + 2\phi} - \sqrt{2\phi}) \quad (1)$$

Here,
$V_{TN}$: threshold voltage
$V_{SB}$: source-bulk voltage
γ: body effect parameter
$V_{T0}$: threshold voltage value when $V_{SB}=0V$
2φ: surface potential parameter As discussed above, basically with the circuit block 21 alone, it is possible to convert a high-voltage logic signal in which the two logical values 0, 1 are expressed by the potential 0V and the potential HV into a low-voltage logic signal in which the two logical values 0, 1 are expressed by the potential VG, which is a variable ground potential, and the potential (VG+LL).

However, depending on the value of the potential VG, the potential difference between the source potential of the transistors X122 and X124 and the standard ground potential 0V could become large. As a result, a marked body effect occurs and the threshold voltage of the transistors increases. Consequently, the transistors become unable to switch normally, so there are cases where this level-conversion operation with the circuit block 21 alone is difficult.

When using a general high-voltage semiconductor process, the bulk potential of the transistors X122 and X124, which are N-channel, high-voltage transistors, must be maintained at the lowest potential in the circuit, in other words at 0V.

Accordingly, when the value of the potential VG changes in the range of 0V to (HV−LL), the source-bulk voltage $V_{SB}$ of the transistors X122 and X124, which are high-voltage NMOS transistors, changes in the range of 0V to (HV−LL).

The source-bulk voltage $V_{SB}$ of the transistors X122 and X124 achieves a maximum value (HV−LL) when the potential VG applied to the sources thereof is set to the maximum value (HV−LL).

At this time, the threshold voltage $V_{TN}$ of the transistors X122 and X124 also becomes a maximum, and that maximum value $V_{TN\_max}$ can be estimated by substituting the value (HV−LL) for $V_{SB}$ in equation (1). On the other hand, the respective maximum values of the gate-source voltages Vgs[X122] and Vgs[X124] of the transistors X122 and X124 are (HV−VG) as discussed above, so the gate-source voltages Vgs[X122] and Vgs[X124] become a minimum value LL when the potential VG is a maximum value.

Accordingly, when the minimum value LL of the gate-source voltage Vgs is not sufficiently larger than the threshold voltage $V_{TN\_max}$, the switching action of the transistors X122 and X124 becomes difficult and the action of the circuit block 21 halts.

The circuit block 22 is provided in order to resolve this problem. As discussed above, the respectively elements in the circuit block 22 are comprised of elements of the opposite polarity from corresponding elements in circuit block 21. Similar to the circuit block 21, the circuit block 22 has the function of converting a high-voltage logic signal in which the two logical values 0, 1 are expressed by the potential 0V and the potential HV into a low-voltage logic signal in which the two logical values 0, 1 are expressed by the potential VG and the potential (VG+LL).

The absolute value of the source-bulk voltage $V_{SB}$ of the transistors X125 and X127, which are high-voltage PMOS transistors, is a maximum value (HV−LL) when the potential (VG+LL) applied to the source is set to a minimum value LL, in other words when the potential VG is set to a minimum value 0V.

Furthermore, from Equation (1) the absolute value of the threshold voltage $V_{TN}$ of the transistors X125 and X127 simultaneously becomes a maximum. Accordingly, while operation of the circuit block 21 is most difficult at the time when the potential VG is a maximum, the switching action in the circuit block 22 is most difficult when the potential VG is a minimum.

The level conversion outputs of the circuit block 21 and the circuit block 22 having this kind of relationship is such that those that output the same logical values are connected to each other. That is to say, the drain of the transistor X122 (node N21) and the drain of the transistor X125 (node N23) are connected, and the drain of the transistor X124 (node N22) and the drain of the transistor X127 (node N24) are connected.

Consequently, if at least one out of the circuit block 21 and the circuit block 22 is operating normally, the voltage values of the nodes N22 and N24 change to VG or VG+LL the same as when the switching operation is correctly performed.

Accordingly, an appropriate value is output as the logic signal Sout to the nodes N22 and N24. Similarly, a voltage corresponding to a logical value that is the logical value of the logic signal Sout reversed appears at the nodes N21 and N23.

Accordingly, even when operation of one out of the circuit blocks 21 and 22 becomes difficult depending on the value of the potential VG, the same logical value as during normal operation appears at the nodes N22 and N24 or at the nodes N21 and N23, so level conversion is accomplished correctly. Furthermore, in a stationary state after the output logical value has been changed, the circuit blocks 21 and 22 do not consume power other than the leakage current.

As explained above, in this level converter the maximum value (HV−LL) of the absolute value of the source-bulk voltage $V_{SB}$ of the transistors X122, X124, X125 and X127 declines the smaller the potential HV is, so the body effect is less likely to have an influence.

Consequently, when the potential HV is set equal to the maximum permissible voltage, in other words to the rated voltage of the high-voltage transistors, if the level converter is designed so the circuit blocks 21 and 22 operate normally, the level converter can operate stably in numerous cases even when the potential HV is reduced from that.

As explained above, with this first embodiment, it is possible to realize a level converter having a function in which a low-voltage logic signal in which the two logical values 0, 1 are expressed by a standard ground potential 0V and a potential LV is converted to a low-voltage logic signal in which the two logical values 0, 1 are expressed by the potential VG and the potential (VG+LL).

This first embodiment was provided with the circuit block 21 and the circuit block 22, which was composed of elements of opposite polarity from the various elements of the circuit block 21. As a result, normal operation can be realized even when the potential VG changes between the standard ground potential 0V and the potential HV−LL. When the potential HV is set lower than the rated voltage of the high-voltage transistors in order to reduce power consumption or in accordance with specifications, it is possible to realize normal operations and it is possible to accomplish stable level conversion. In a stationary state in which the input signal continues to maintain a fixed logical value, power consumption becomes 0.

Consequently, it is possible to accomplish level conversion required for data reception by the internal logic circuits of the high-voltage integrated circuit, and it is possible to control high-voltage integrated circuits by external controllers.

Figure 4:
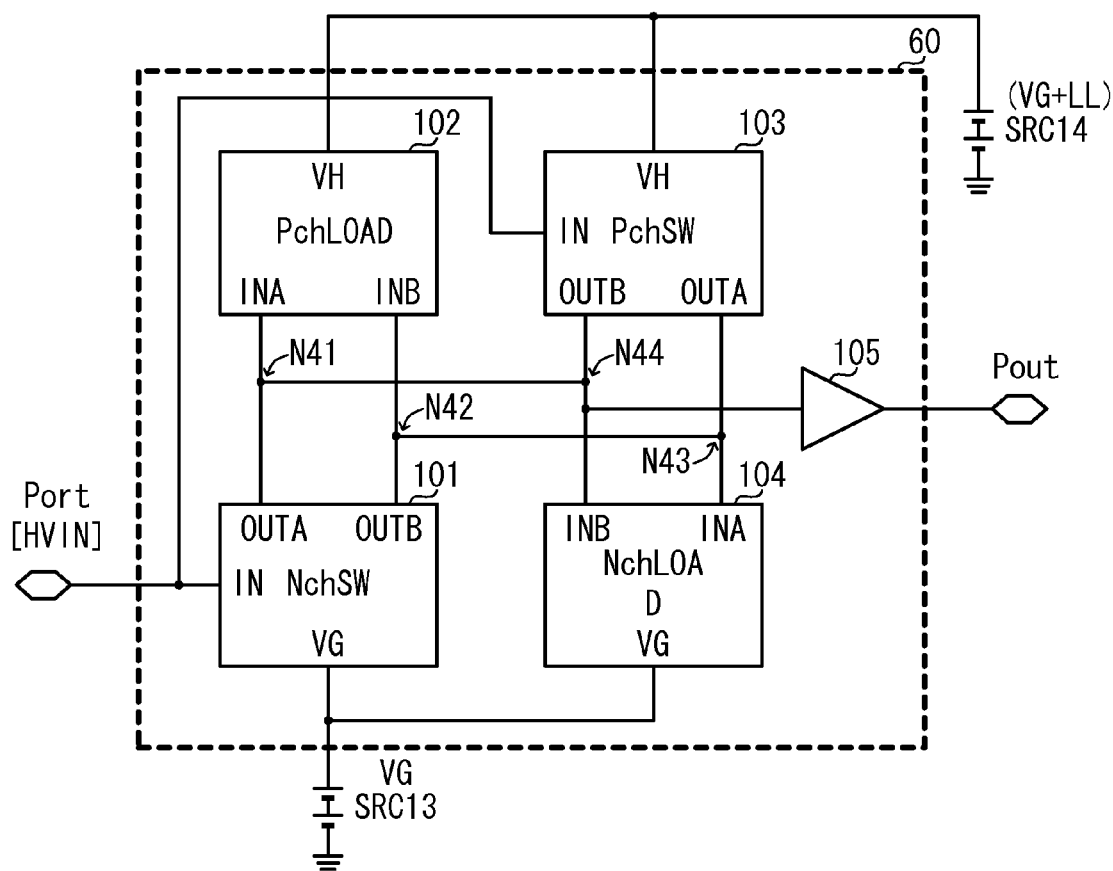
FIG. 4 is a block diagram illustrating a first block of the level converter according to the first embodiment as a system in which multiple specific-function blocks are connected.

The circuit block 20 is illustrated as a system 60 in which multiple basic function blocks are connected, in FIG. 4.

The circuit block 60 is composed of an NchSW 101, a PchLOAD 102, a PchSW 103, an NchLOAD 104 and a buffer 105.

The NchSW 101 is a switching circuit composed of a high-voltage NMOS transistor and has terminals IN, VG, OUTA and OUTB. The bulk potential of the high-voltage NMOS transistor inside the NchSW 101 is maintained at 0V.

The NchSW 101 has the role of connecting or opening the circuit between the terminal VG and the terminal OUTA and opening or connecting the circuit between the terminal VG and the terminal OUTB in accordance with the logical value 0/1 of the logic signal supplied to the terminal IN.

The terminal VG is connected to the power source SRC13 of voltage VG. The terminal IN is connected to the input terminal Port[HVIN] and a high-voltage logic signal expressed by the potential 0V/HV is applied.

The NchSW 101 is realized using the transistors X109, X110, X122 and X124 in the composition of FIG. 1.

The terminal IN of the NchSW 101 corresponds to the input terminal node N14 of the inverter 13 shown in FIG. 1 and the terminal VG corresponds to the source terminals of the transistors X122 and X124.

The terminal OUTA corresponds to the drain terminal of the transistor X124 shown in FIG. 1, and the terminal OUTB corresponds to the drain terminal of the transistor X122.

The PchLOAD 102 has terminals VH, INA and INB. In the PchLOAD 102, when one out of the terminals INA and INB is in a high impedance state (open state) and a voltage lower by a fixed value than the potential of the terminal VH is applied to the other, the potential of the terminal in a high impedance state is made equal to the potential of the terminal VH.

The terminal VH is connected to the positive terminal of the power source SRC14 of potential (VG+LL). The terminal INA of the PchLOAD 102 is connected to the terminal OUTA of the NchSW 101. This connection point is called a node N41. The terminal INB of the PchLOAD 102 is connected to the terminal OUTB of the NchSW 101. This connection point is called a node N42.

The PchLOAD 102 is realized using the transistors X121 and X123 in the composition of FIG. 1.

The terminal VH of the PchLOAD 102 corresponds to the source of the transistors X121 and X123 shown in FIG. 1. The terminal INA corresponds to the node to which the drain of the transistor X123 and the gate of the transistor X121 are connected, and the terminal INB corresponds to the node to which the drain of the transistor X121 and the gate of the transistor X123 are connected.

The nodes N41 and N42 respectively correspond to the nodes N22 and N21 shown in FIG. 1.

The PchSW 103 is a switching circuit composed of high-voltage PMOS transistors and has terminals IN, VH, OUTA and OUTB. The bulk potential of the high-voltage PMOS transistors of the PchSW 103 is maintained at HV.

The PchSW 103 serves the role of connecting/opening the circuit between the terminal VH and the terminal OUTA, and opening/connecting the circuit between the terminal VH and the terminal OUTB, in accordance with the logical value 0/1 of a logic signal supplied to the terminal IN.

The terminal VH is connected to the positive terminal of the power source SRC14 of potential (VG+LL). The terminal IN is connected to the input terminal Port[HVIN] and a high-voltage logic signal expressed by the potential 0V/HV is applied.

The PchSW 103 is realized using the transistors X109, X110, X125 and X127 in the composition of FIG. 1.

The terminal IN of the PchSW 103 corresponds to the input terminal node N14 of the inverter 13 shown in FIG. 1, and the terminal VH corresponds to the source of the transistors X125 and X127.

The terminal OUTA corresponds to the drain of the transistor X125 shown in FIG. 1, and the terminal OUTB corresponds to the drain of the transistor X127.

The NchLOAD 104 has terminals VG, INA and INB. In the NchLOAD 104, when one out of the terminals INA and INB is in a high impedance state (open state) and a voltage higher by a fixed value than the potential of the terminal VG is applied to the other, the potential of the terminal in a high impedance state is made equal to the potential of the terminal VG.

The terminal VG is connected to the power source SRC13 of voltage VG. The terminal INA of the NchLOAD 104 is connected to the terminal OUTA of the PchSW 103. This connection point is called a node N43. The terminal INB of the NchLOAD 104 is connected to the terminal OUTB of the PchSW 103. This connection point is called a node N44.

The NchLOAD 104 is realized using the transistors X126 and X128 in the composition of FIG. 1.

The terminal VG of the NchLOAD 104 corresponds to the source of the transistors X126 and X128 shown in FIG. 1.

The terminal INA corresponds to the node to which the drain of the transistor X126 and the gate of the transistor X128 shown in FIG. 1 are connected, and the terminal INB corresponds to the drain of the transistor X128 and the gate of the transistor X126.

The nodes N43 and N44 respectively correspond to the nodes N23 and N24 shown in FIG. 1, and the node N41 and the node N44 are connected, and the node N42 and the node N43 are connected.

The buffer 105 accomplishes waveform shaping and fan-out strengthening. The input terminal of the buffer 105 is connected to the node N44, and the output terminal is connected to the output terminal Pout.

The buffer 105 is realized through the inverter 23 using the transistors X129 and X130 in the composition of FIG. 1.

When a high-voltage logic signal expressed by the potential 0V is applied to the input port Port[HVIN] in the circuit block 60 composed in this manner, the potential of the terminal IN of the NchSW 101 equals 0V. Furthermore, in the NchSW 101 the terminal OUTA and the terminal VG are connected and the terminal OUTB is in an open state.

If the impedance between the terminal INA of the PchLOAD 102 and the positive terminal (potential VG) of the power source SRC13 is sufficiently low and the node N42 is in a high-impedance state, the potential of the terminal INA (the node N41) becomes VG and the potential of the terminal INB (the node N42) becomes (VG+LL).

In addition, in the PchSW 103 the terminal OUTA and the terminal VH are connected and the terminal OUTB is in an open state.

If the impedance between the terminal INA of the NchLOAD 104 and the positive terminal (potential VG+LL) of the power source SRC14 is sufficiently low and the node N44 is in a high-impedance state, the potential of the terminal INA (the node N43) becomes VG+LL and the potential of the terminal INB (the node N44) becomes VG.

The node N41 and the node N44 are connected and the potential of both is VG, so the potential of the output terminal Pout becomes VG at the output of the buffer 105, which serves the role of an inverter, has accomplished waveform shaping and fan-out strengthening.

When a high-voltage logic signal expressed by the potential HV is applied to the input terminal Port[HVIN], the potentials of the terminal IN of the NchSW 101 and the PchSW 103 both become HV. In this case, the potential of the output terminal Pout conversely becomes VG.

The high-voltage NMOS transistor of the NchSW 101 is more susceptible to the body effect and switching becomes difficult the higher the potential VG is. However, because the node N42 and the node N43 are connected and the node N41 and the node N44 are connected, the influence of the body effect on the high-voltage PMOS transistor of the PchSW 103 becomes smaller the higher the potential VG is. Accordingly, the high-voltage PMOS transistor of the PchSW 103 operates stably.

On the other hand, the high-voltage PMOS transistor of the PchSW 103 is more susceptible to the body effect and switching becomes difficult the lower the potential VG is. However, the influence of the body effect on the high-voltage NMOS transistor of the NchSW 101 becomes smaller the lower the potential VG is. Accordingly, the high-voltage NMOS transistor of the NchSW 101 operates stably.

In this manner, in the circuit block 60 shown in FIG. 4, one out of the NchSW 101 and the PchSW 103 stably accomplishes switching irrespective of the potential VG.

Accordingly, the level converter outputs from the output terminal OUT a logic signal expressing two logical values through potentials VG/(VG+LL) normally level converted without regard to how high or low the potential VG is.

The NchSW 101, the PchLOAD 102, the PchSW 103, the NchLOAD 104 and the buffer 105 of the circuit block 60 are not limited to respectively corresponding elements of the circuit block 20.

For example, the NchLOAD 104 can also be composed by connecting a resistance between the terminal INA and the terminal VG and between the terminal INB and the terminal VG, or by a current mirror. However, in these compositions, unlike the circuit in FIG. 1, the operating current would not become 0 even in a stationary state, so power consumption would increase.

Thus, the circuit block 20 of the level converter shown in FIG. 1 can be expressed as the circuit block 60 shown in FIG. 4.

Second Embodiment

The level converter according to the second embodiment converts a low-voltage logic signal in which the two logical values 0, 1 are expressed by a potential VG that is a variable ground potential and a potential (VG+LL) which is the potential VG to which the positive fixed voltage LL has been added and which changes in accordance with the obtained value of VG into a low-voltage logic signal in which the two logical values 0, 1 are expressed by the standard ground potential 0V and a low constant potential LV.

Figure 2:
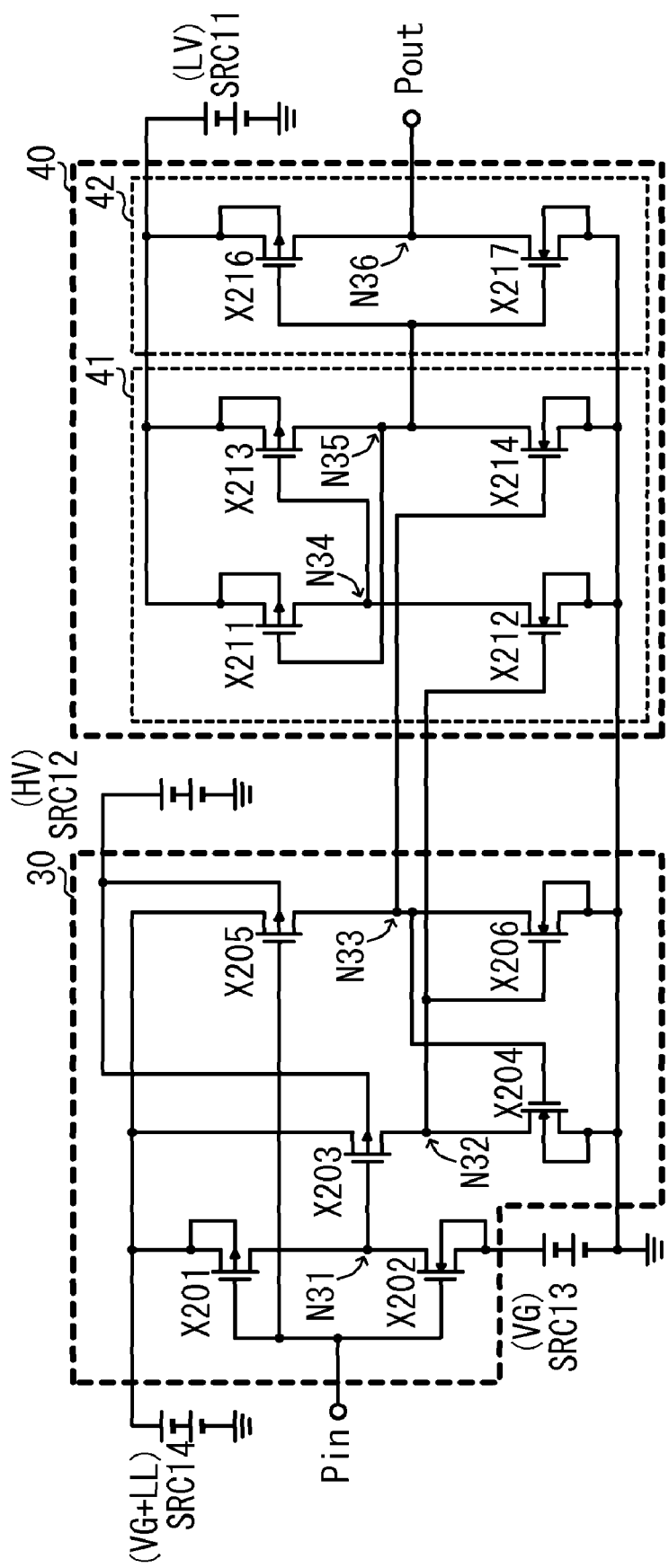
FIG. 2 is a circuit diagram showing a specific composition (1) of a level converter for converting high-voltage logic signals into low-voltage logic signals according to a second embodiment of the present invention.

The level converter according to the second embodiment is composed of a circuit block 30 and a circuit block 40, as shown in FIG. 2.

This level converter is connected, for example, between a controlling logic circuit such as a microcontroller provided externally to the high-voltage integrated circuit, and an internal logic circuit provided internally to the high-voltage integrated circuit, the same as in the first embodiment.

The input terminal Pin is connected to the internal logic circuit and is input with a low-voltage input signal (logic signal) in which the logical values are set by the potential VG and the potential (VG+LL). In addition, the output terminal Pout is connected to the controlling logic circuit and the level converter outputs an output signal Sout of the standard ground potential 0V or the potential LV to this controlling logic circuit.

The circuit block 30 is a circuit block that converts a low-voltage logic signal in which the two logical values 0, 1 are expressed by the potential VG and the potential (VG+LL) into a high-voltage logic signal in which the two logical values 0, 1 are expressed by 0V and the potential (VG+LL).

The circuit block 40 is a circuit block that converts a high-voltage logic signal in which the two logical values 0, 1 are expressed by the ground potential 0V and the potential (VG+LL) into a low-voltage logic signal in which the two logical values 0, 1 are expressed by 0V and the potential LV.

The circuit block 30 is provided with transistors X201 to X206. The transistor X201 is a low-voltage PMOS transistor and the transistor X202 is a low-voltage NMOS transistor.

The transistor X203 and the transistor X205 are high-voltage PMOS transistors that have mutually identical parameters. Furthermore, the transistor X204 and the transistor X206 are high-voltage NMOS transistors that have mutually identical parameters.

For the transistors X203 and X205, transistors with a large W value are used so that the drain-source resistance at the on-state is sufficiently low even when the transistors are driven by a low gate-source voltage. In addition, for the transistors X204 and X206, transistors with a large L value are used in order to increase the drain-source resistance and enlarge the voltage drop that appears between that drain and source during switching operations.

The source and the bulk of the transistor X201 are connected to the positive terminal of the power source SRC14 whose potential is (VG+LL), and the drain of the transistor X201 and the drain of the transistor X202 are connected to each other. This connection point is called a node N31. The source and the bulk of the transistor X202 are connected to the positive terminal of the power source SRC13 whose potential is VG. The negative terminals of the power sources SRC13 and SRC14 are both grounded to 0V.

The gate of the transistor X201 and the gate of the transistor X202 are both connected to the input terminal Pin.

The source of the transistor X203 is connected to the positive pole of the power source SRC14 and the bulk is connected to the positive terminal of the power source SRC12 whose potential is HV. The drain of the transistor X203 and the drain of the transistor X204 are connected to each other. This connection point is called a node N32. The source and the bulk of the transistor X204 and the negative terminal of the power source SRC12 are grounded to 0V.

The source of the transistor X205 is connected to the positive terminal of the power source SRC14, and the bulk is connected to the positive terminal of the power source SRC12. The drain of the transistor X205 and the drain of the transistor X206 are connected to each other. This connection point is called a node N33. The source and the bulk of the transistor X206 are grounded to 0V.

The gate of the transistor X203 is connected to the node N31, and the gate of the transistor X204 is connected to the node N33. The gate of the transistor X205 is connected to the input terminal Pin, and the gate of the transistor X206 is connected to the node N32.

The circuit block 40 is composed of circuit blocks 41 and 42. The circuit block 41 is composed of transistors X211 to X214.

The transistor X211 and the transistor X213 are low-voltage PMOS transistors that have mutually identical parameters. Furthermore, the transistor X212 and the transistor X214 are high-voltage NMOS transistors that have mutually identical parameters.

The source and the bulk of the transistor X211 are connected to the positive terminal of the power source SRC11, whose potential is LV. The drain of the transistor X211 and the drain of the transistor X212 are connected to each other. This connection point is called a node N34. The source and the bulk of the transistor X212 and the negative terminal of the power source SRC11 are grounded to 0V.

The source and the bulk of the transistor X213 are connected to the positive terminal of the power source SRC11. The drain of the transistor X213 and the drain of the transistor X214 are connected to each other. This connection point is called a node N35. The source and the bulk of the transistor X214 are grounded to 0V.

The gate of the transistor X211 is connected to the node N35, and the gate of the transistor X212 is connected to the node N32. The gate of the transistor X213 is connected to the node N34, and the gate of the transistor X214 is connected to the node N33.

The circuit block 42 comprises an inverter and is composed of transistors X216 and X217. The transistor X216 is a low-voltage PMOS transistor, and the transistor X217 is a low-voltage NMOS transistor.

The source and the bulk of the transistor X216 are connected to the positive terminal of the power source SRC11. The drain of the transistor X216 and the drain of the transistor X217 are connected to each other. This connection point is called a node N36. The source and the base of the transistor X217 are grounded to 0V.

The gate of the transistor X216 and the gate of the transistor X217 are both connected to the node N35.

Next, the operation of the level converter according to the second embodiment will be explained.

When the potential of the logic signal input to the input terminal Pin is equal to (VG+LL), the transistor X205 is off because the gate-source voltage Vgs[X205] is 0V.

In addition, at this time the output potential V[N31] of the inverter composed of the transistors X201 and X202 is VG. The transistor X203 turns on because the gate-source voltage Vgs[X203] is –LL, and the when the transistor X204 is in an off state, the potential V[N32] of the node N32 becomes (VG+LL).

When the potential V[N32] becomes (VG+LL), the transistor X206 turns on because the gate-source voltage Vgs]X206] becomes (VG+LL).

When the transistor X205 is in an off state and the transistor X206 is on, the potential V[N33] of the node N33 becomes 0V. Furthermore, the transistor X204 is off because the gate-source voltage Vgs[X204] becomes 0V.

When the potential V[N32] is (VG+LL), the transistor X212 of the circuit block 41 turns on because the gate-source voltage Vgs[X212] becomes (VG+LL).

When the transistor X212 turns on, the potential V[N34] of the node N34 ideally drops to 0V through the voltage drop. The transistor X213 turns on because the gate-source voltage Vgs[X213] becomes –LV.

When the potential V[N33] is 0V, the transistor X214 turns off because the gate-source voltage Vgs[X214] becomes 0V. When the transistor X214 is in an off state and the transistor X213 is in an on state, the potential V[N35] of the node N35 becomes LV.

When the potential V[N35] becomes LV, the transistor X211 turns off because the gate-source voltage Vgs[X211] becomes 0V.

In addition, when the potential V[N35] becomes LV, the potential V[N36] of the node N36 becomes 0V through the inverter of the circuit block 42. Furthermore, this circuit block 40 outputs this potential V[N36]=0V of the node N36 as a logic signal expressing the logical value 0.

On the other hand, when the potential of the logic signal input to the input terminal Pin is equal to VG, then V[N36] =LV.

This circuit block 30 has substantially the same structure as a circuit in which the polarity of the transistors in the conventional level converter shown in FIG. 8 is reversed, the power source SRC14 is connected to the ground line thereof, the power source SRC13 is connected to the low-voltage power source line in place of the power source SRC1 (potential LV) and 0V, in other words a ground line, is connected to the high-voltage power source line instead of the power source SRC2 (potential HV).

However, the bulk potential of the high-voltage transistor X203 and the high-voltage transistor X205 needs to be fixed at the maximum output voltage of the variable-voltage power source SRC14, that is, at the potential HV. This bulk potential differs from the potential (VG+LL) applied to the sources of the transistors X203 and X205.

In contrast, in the level converter shown in FIG. 8, the source potential and the bulk potential of the high-voltage NMOS transistors X6 and X8 are held at the same 0V.

In addition, in contrast to the ground line being fixed at 0V in the level converter of FIG. 8, the positive power source line of the circuit block 30 is connected to the positive terminal of the power source SRC14 of output potential (VG+LL), so the potential VG can be changed by settings.

Accordingly, unlike the level converter shown in FIG. 8, with the circuit block 30 the source-bulk voltage $V_{SB}$ of the transistors X203 and X205, which are high-voltage PMOS transistors, varies in the range of 0V to (HV−LL), so the influence of the above-described body effect appears markedly.

In particular, when the potential VG is set to 0V, the absolute value of the threshold voltage $V_{TN}$ of the transistors X203 and X205 is at its maximum. Accordingly, when a conventional level converter is used, the switching operation becomes difficult.

Consequently, as a countermeasure to this body effect, in the circuit block 30 transistors with high W-value are used in transistors X203 and X205, which are high-voltage PMOS transistors, in comparison to the transistors used in the conventional level converter. In other words, the circuit block 30 is designed such that even when the threshold voltage $V_{TN}$ is increased due to the body effect, the ON resistance between drain and source remains sufficiently low.

In addition, transistors with larger L-value than in the conventional level converter are used for the transistors X204 and X206, which are high-voltage NMOS transistors, so that the drain-source resistance increases and the voltage drop that appears between drain and source during the switching operation becomes larger.

Figure 3:
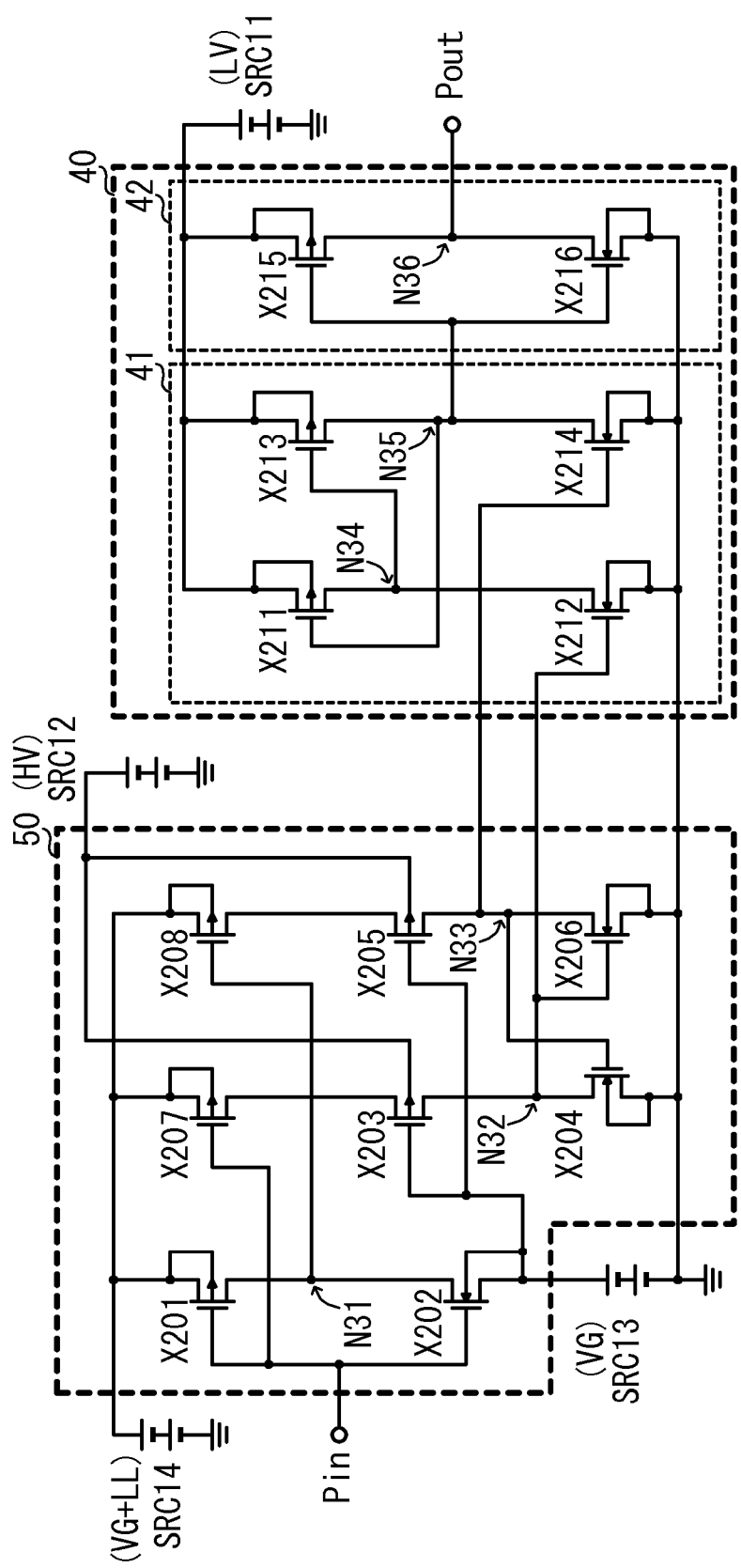
FIG. 3 is a circuit diagram showing a specific composition (2) of a level converter according to the second embodiment.

In the above-described second embodiment, the level converter may be provided with a circuit block 50, the composition of which is shown in FIG. 3, instead of the circuit block 30.

With the level converter shown in FIG. 2, when the value of the potential (HV−LL) is particularly large and the influence of the body effect is marked, it is necessary for the W-value of the transistors X203 and X205, which are high-voltage PMOS transistors, and the L-value of the transistors X204 and X206, which are high-voltage NMOS transistors, to be large.

When this W-value and L-value become large, the area of the transistors X203 and X205 on the integrated circuit increases. Consequently, the necessity arises of also enlarging the area of the transistors X201 and X202, which are the low-voltage transistors of the preceding stage for driving the transistors X203 and X205. As a result, the area occupied by the circuit block 30 becomes larger.

The level converter shown in FIG. 3 copes with this problem and is configured so as to realize compactness.

The source and the bulk of the transistor X207 and the source and the bulk of the transistor X208 are connected to the positive terminal of the power source SRC14.

The source of the high-voltage PMOS transistor X203 is connected to the drain of the transistor X207, and the source of the high-voltage PMOS transistor X205 is connected to the drain of the transistor X208.

The gate of the transistor X207 is connected to the input terminal Pin. The gate of the transistor X208 is connected to the node N31. The gates of the transistors X203 and X205 are connected to the positive terminal of the power source SRC13.

By having this kind of circuit composition, it is possible to always keep the value of the drain-source voltage of the low-voltage transistors X207 and X208 within the range of 0V to −LL below the rated voltage, and to switch the drain voltage of the transistors X204 and X206, which are high-voltage NMOS transistors, between 0V and (VG+LL), the same as with the circuit block 30 shown in FIG. 2.

With the composition of FIG. 3, the bulk potential and the source potential of the low-voltage transistors X207 and X208 are both maintained at the potential (VG+LL), so little influenced from the body effect. On the other hand, the high-voltage PMOS transistors X203 and X205 are influenced from the body effect because the bulk potential thereof is fixed at HV. However, at the time of a switching operation, the threshold voltage of the low-voltage transistors X207 and X208 which provide drive current to the high-voltage NMOS transistors X204 and X206 is lower than that of the high-voltage transistors. Consequently, even when the transistors X203 and X205 in FIG. 3 are elements with a smaller W-value than the high-voltage PMOS transistors X203 and X205 of FIG. 2, the operation can normally be accomplished with little deterioration of switching properties.

In addition, because the low-voltage transistors X207 and X208 are used, the circuit area virtually does not increase compared to the circuit of FIG. 2, so the drain current at the time of the switching operation can be easily increased.

Consequently, even when the area is reduced by using elements with smaller L-value than the transistors X204 and X206 of FIG. 2, the voltage drop that appears between the drain and source of each at the time of the switching operation is sufficiently large so the circuit block 50 can be made to operate normally.

In addition, because the low-voltage transistors X207 and X208 are used, it is possible to reduce the area of the driving inverter composed of the transistors X201 and X202 in the prior stage.

In this manner, the composition of the circuit block 50 is such that the high-voltage transistors X207 and X205 have been added, in comparison to the circuit block 30. Although the number of elements has increased, it is possible to reduce the size of the multiple elements compared to those in FIG. 2 without causing performance to deteriorate, as discussed above. Consequently, normally the area of the circuit block 50 as a whole is smaller than that of the circuit block 30.

In addition, the lower the potential HV, the more the maximum value (HV−LL) of the source-bulk voltage $V_{SB}$ of the transistors X203 and X205 of the level converter shown in FIG. 3 and the level converter shown in FIG. 2 declines, making the switching operation easy. Consequently, if the circuits of the level converter shown in FIG. 2 or the level converter shown in FIG. 3 are designed so as to operate normally when this potential HV is at a maximum value, in other words, when this is equal to the rated voltage of the high-voltage transistors, it is possible to operate the same circuit normally and without problems even when the potential HV is low.

Accordingly, it is possible to convert a low-voltage logic signal in which the two logical values 0, 1 are expressed by the potential VG and the potential (VG+LL) into a low-voltage logic signal in which the two logical values 0, 1 are expressed by the standard ground potential 0V and the potential LV. As a result, it is possible to accomplish level conversion needed for data transmission from internal logic circuits in a high-voltage integrated circuit.

Furthermore, it is possible to realize normal operation even when the potential VG is changed between the standard ground potential 0V and the potential HV−LL. Even when the potential HV is set lower than the rated voltage of the high-voltage transistors in order to reduce power consumption, it is invariably possible to realize normal operation and it is possible to accomplish stable level conversion. In addition, power consumption is 0 in a stationary state in which the input signal is maintained at a fixed logical value.

Figure 5:
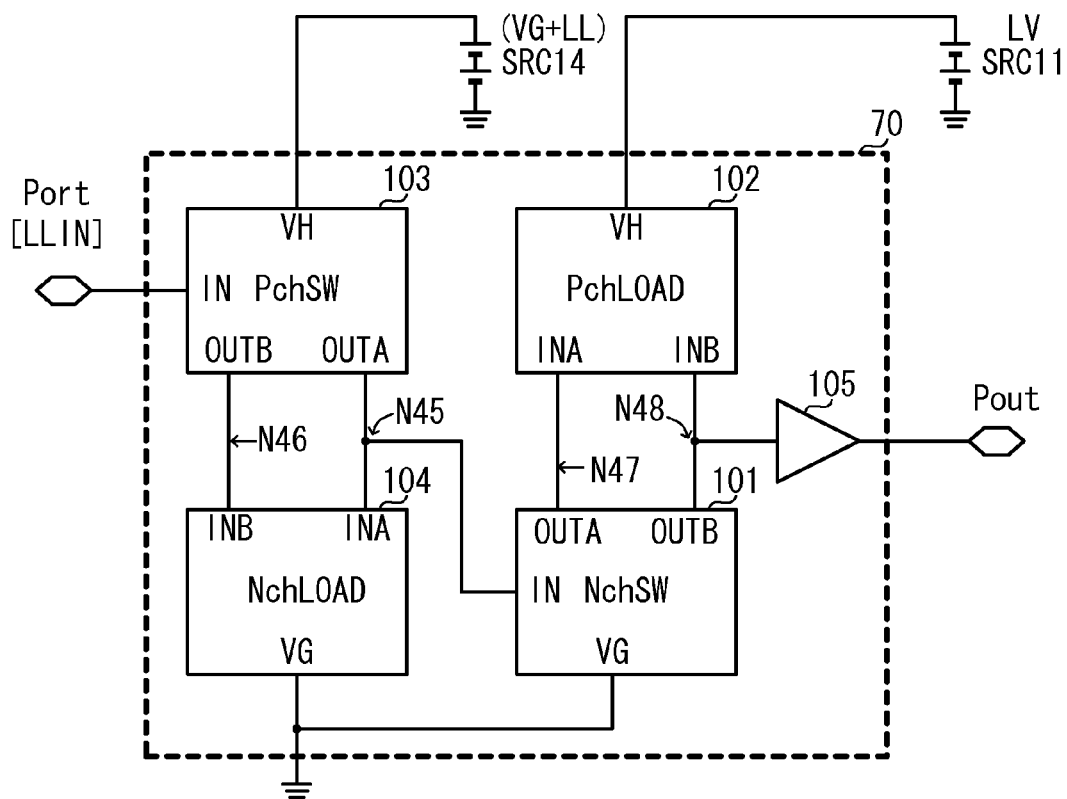
FIG. 5 is a block diagram (1) illustrating the level converter according to the second embodiment as a system in which multiple specific-function blocks are connected.
Figure 6:
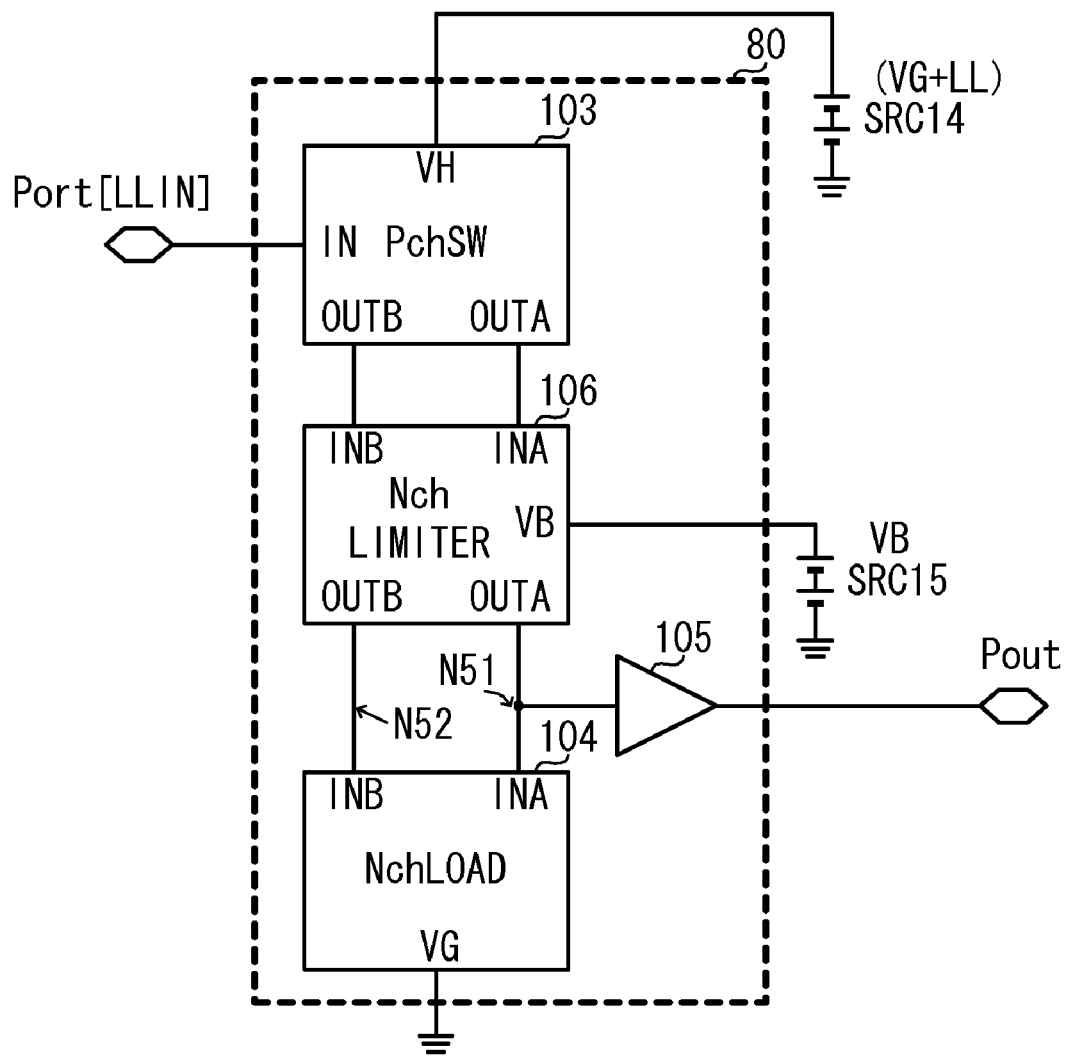
FIG. 6 is a block diagram (2) illustrating the level converter according to the second embodiment as a system in which multiple specific-function blocks are connected.

Next, it is possible to express the level converter (FIGS. 2, 3) according to the second embodiment as a system in which multiple basic function blocks are connected, as shown in FIG. 5 and FIG. 6.

First, the level converter shown in FIG. 5 is described.

The level converter shown in FIG. 5 is composed of a circuit block 70. This circuit block 70 is a circuit in which a low-voltage logic signal in which the potentials VG/(VG+LL) are expressed is applied to the input terminal Port[LLIN] from the internal low-voltage logic circuit of the high-voltage integrated circuit, and converting this into a low-voltage logic signal in which the two logical values 0, 1 are expressed by the standard ground potential 0V and the low potential LV.

Similar to the circuit block 60, the circuit block 70 is composed of an NchSW 101, a PchLOAD 102, a PchSW 103, an NchLOAD 104 and a buffer 105.

The NchSW 101, the PchLOAD 102, the PchSW 103, the NchLOAD 104 and the buffer 105 have the same functions as shown in FIG. 4. The bulk potential of the high-voltage NMOS transistor inside the NchSW 101 is held at 0V, and the bulk potential of the high-voltage PMOS transistor inside the PchSW 102 is held at HV.

The terminal IN of the PchSW 103 is connected to the input terminal Port[LLIN], and a low-voltage logic signal expressed by the potential VG/(VG+LL) is input.

The terminal VH of the PchSW 103 is connected to the positive terminal of the power source SRC14 at voltage (VG+LL). The terminal VG of the NchLOAD 104 is connected to a ground line at 0V.

The terminal INA of the NchLOAD 104 and the terminal OUTA of the PchSW 103 are connected to each other and this connection point is called a node N45. The terminal INB of the NchLOAD 104 and the terminal OUTB of the PchSW 103 are connected to each other and this connection point is called a node N46.

The terminal IN of the NchSW 101 is connected to the node N45 and the terminal VG is connected to the ground line at 0V. The terminal V11 of the PchLOAD 102 is connected to the positive terminal of the power source SRC11 at voltage LV.

The terminal INA of the PchLOAD 102 and the terminal OUTA of the NchSW 101 are connected to each other and this connection point is called a node N47. The terminal INB of the PchLOAD 102 and the terminal OUTB of the NchSW 101 are connected to each other and this connection point is called a node N48.

The input terminal of the buffer 105 is connected to the node N48, and the output terminal is connected to the output terminal Pout.

The PchSW 103 is realized using the transistors X201, X202, X203 and X205 in the composition of FIG. 2.

The terminal IN of the PchSW 103 corresponds to the Pin terminal of FIG. 2, and the terminal V11 corresponds to the source of the transistors X203 and X205.

The terminal OUTA corresponds to the drain of the transistor X205 and the terminal OUTB corresponds to the drain of the transistor X203.

The NchLOAD 104 is realized using the transistors X204 and X206 in the composition of FIG. 2. The terminal VG corresponds to the source of the transistors X204 and X206.

The terminal INA corresponds to the node shown in FIG. 2 to which the drain of the transistor X206 and the gate of the transistor X204 are connected, and the terminal INB corresponds to the node to which the drain of the transistor X204 and the gate of the transistor X206 are connected.

The node N45 corresponds to the node N33 shown in FIG. 2 and the node N46 corresponds to the node N32.

The NchSW 101 is realized using the transistors X212 and X214 in the composition of FIG. 2. The terminal IN corresponds to the gate of the transistor X214 shown in FIG. 2. The terminal VG corresponds to the source of the transistors X212 and X214.

The terminal OUTA corresponds to the drain of the transistor X212 and the terminal OUTB corresponds to the drain of the transistor X214. As discussed above, a voltage equivalent to the reversed value of the logic signal input into the gate of the transistor X214 is applied to the gate of the transistor X212 in FIG. 2.

The PchLOAD 102 is realized using the transistors X211 and X213 in the composition of FIG. 2. The terminal VH corresponds to the source of the transistors X211 and X213 shown in FIG. 2

The terminal INA corresponds to the node to which the drain of the transistor X211 shown in FIG. 2 and the gate of the transistor X213 are connected, and the terminal INB corresponds to the node to which the drain of the transistor X213 and the gate of the transistor X211 are connected.

The node N47 corresponds to the node N34 shown in FIG. 2, and the node N48 corresponds to the node N35.

The buffer 105 is realized using an inverter composed of the transistors X216 and X217 in the composition of FIG. 2. The input terminal of the buffer 105 is connected to the node N48, and the output terminal is connected to the output terminal Pout.

In the circuit block 70 composed in this manner, when a high-voltage logic signal expressed by the potential VG is applied to the input terminal Port[LLIN], the potential of the terminal IN of the PchSW 103 becomes equal to VG. Furthermore, in the PchSW 103, the terminal OUTA and the terminal VH are shorted and the terminal OUTB is in an open state.

If the impedance between the terminal INA of the Nch-LOAD 104 and the positive pole of the power source SRC14 is sufficiently low and the node N46 is in a high impedance state, the potential of the terminal INA becomes (VG+LL) and the potential of the terminal INB becomes 0V.

At this time, the potential of the terminal IN of the NchSW 101 connected to the node N45 also becomes VG+LL. Consequently, the terminal OUTB and the terminal VG are shorted and the terminal OUTA assumes an open state.

When the impedance between the terminal INB of the PchLOAD 102 and the 0V ground line is sufficiently low and the node N47 is in a high impedance state, the potential of the terminal INA (the node N47) becomes LV and the potential of the terminal INB (the node N48) becomes 0V.

Accordingly, the potential of the output signal Sout becomes LV at the output of the buffer 105, which acts as an inverter for waveform shaping and fan-out strengthening with the voltage of the node N48 as the input.

On the other hand, when a high-voltage logic signal expressed by the potential VG+LL is applied to the input terminal Port[LLIN], in this case the potential of the output signal Sout becomes 0V.

The bulk potential of the high-voltage PMOS transistors of the PchSW 103 is held at HV as discussed above. On the other hand, the sources of these transistors are connected to the positive terminal of the power source SRC14 at voltage (VG+LL) via the terminal VH, so the source potential of these transistors becomes less than (VG+LL). Consequently, the smaller the potential VG becomes, the more the high-voltage PMOS transistors inside the PchSW 103 are influenced by the body effect and switching becomes difficult.

Next, the level converter shown in FIG. 6 is described.

The level converter shown in FIG. 6 is composed of a circuit block 80. This circuit block 80 is composed of the PchSW 103, the NchLOAD 104, a NchLIMITER 106 and the buffer 105. The PchSW 103, the NchLOAD 104 and the buffer 105 have the same roles as those shown in FIG. 4.

The terminal VH of the PchSW 103 is connected to the positive terminal of the power source SRC14 at voltage (VG+LL), and a low-voltage logic signal expressed by the potential VG/(VG+LL) is applied to the terminal IN from the input terminal Port[LLIN]. In addition, the terminal VG of the NchLOAD 104 is grounded to 0V.

The bulk potential of the high-voltage PMOS transistors provided in the PchSW 103 is held at HV.

The NchLIMITER 106 has terminals VB, INA, INB, OUTA and OUTB, and is a circuit that has the function of putting the terminal INA and the terminal OUTA in a conductive state when the potential of the terminal VB is higher by at least a fixed value VT than the potential of the terminal OUTA, and in an open state otherwise. In addition, similarly for the terminals INB and OUTB, the NchLIMITER 106 puts the terminal INB and the terminal OUTB in a conductive state when the potential of the terminal VB is higher by at least a fixed value VT than the potential of the terminal OUTB, and in an open state otherwise.

The positive terminal of the power source SRC15 at reference voltage VB is connected to the terminal VB.

The terminal INA of the NchLIMITER 106 and the terminal OUTA of the PchSW 103 are connected to each other, and the terminal INB of the NchLIMITER 106 and the terminal OUTB of the PchSW 103 are connected to each other.

The terminal OUTA of the NchLIMITER 106 and the terminal INA of the NchLOAD 104 are connected to each other. This connection point is called a node N51. The terminal OUTB of the NchLIMITER 106 and the terminal INB of the NchLOAD 104 are connected to each other. This connection point is called a node N52.

The input terminal of the buffer 105 is connected to the node N51, and the output terminal is connected to the output terminal Pout.

Excluding the NchLIMITER 106, the circuit block 80 has the same topology as the left side part of the circuit block 70 composed of the PchSW 103 and the NchLOAD 104 shown in FIG. 5. Accordingly, from the explanation of the circuit block 70, if the left and right current paths in the NchLIMITER 106 (that is to say, the current path from the terminal INB of the NchLIMITER 106 to the terminal OUTB, and the current path from the terminal INA to the terminal OUTA) are both in a conductive state, the potential of the node N51 or N52 rises from 0V to VG+LL in accordance with the input signal.

However, in the circuit block 80, at the time when the potential of the nodes N51 and N52 has risen above the potential (VB−VT), through the function of the above-described NchLIMITER 106 the corresponding current path assumes a non-conductive state. By interrupting the flow of electric current, the rising of the potential of that node due to charging of parasitic capacitance is halted.

Consequently, it can be seen that the potential of the node N51 and the node N52 is set to 0V or the value (VB−VT) in accordance with the value of the input logic signal. By setting the value of VB so that (VB−VT) is substantially equal to LV and driving the buffer 105 at the power source voltage LV, it is possible to output a low-voltage logic signal expressing the binary values by 0V/LV to the terminal Pout.

The bulk potential of the high-voltage PMOS transistors of the PchSW 103 is held at the potential HV while the source potential is less than the potential (VG+LL) of the terminal VH. Consequently, the smaller the potential VG, the more the high-voltage PMOS transistors in the PchSW 103 are influenced by the body effect and the more difficult switching becomes.

Figure 7:
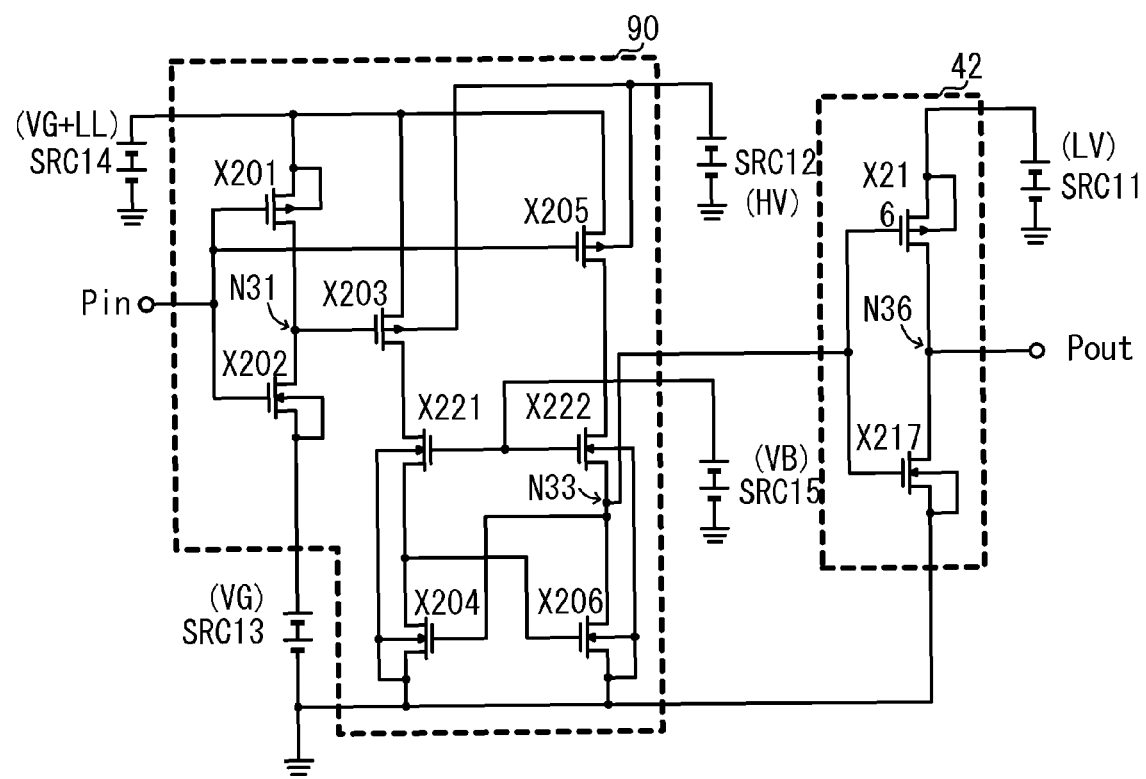
FIG. 7 is a circuit diagram showing the specific composition of the level converter according to FIG. 6.

FIG. 7 is an example of the circuit blocks of FIG. 6 implemented at the transistor level.

The level converter shown in FIG. 7 is composed of circuit block 90 and circuit block 42.

The PchSW 103 shown in FIG. 6 is realized using transistors X201, X202, X203 and X205 with the exact same composition and circuit topology in the composition of FIG. 7 as in FIG. 2.

The NchLOAD 104 shown in FIG. 6 is realized using the transistors X204 and X206 and the exact same circuit topology in FIG. 7 as in FIG. 2. However, as discussed above, because the potential of the terminals INA and INB in the system of FIG. 6 is controlled so as to not rise to more than LV, low-voltage NMOS transistors are used for the transistors X204 and X206. Through this, the die area can be reduced compared to FIG. 2.

The buffer 105 is realized using the inverter 42 in FIG. 7.

Accordingly, similar to the case of FIG. 2, through the circuit in FIG. 7 it can be seen that the PchSW 103, the NchLOAD 104 and the buffer 105 having the above-described functions can be correctly realized.

The NchLIMITER 106 shown in FIG. 6 is realized using transistors X221 and X222 in FIG. 7. The transistors X221 and X222 are the same type and size of high-voltage NMOS transistors.

The input terminal INA of the NchLIMITER 106 shown in FIG. 6 corresponds to the drain of the transistor X222 shown in FIG. 7, and the terminal INB corresponds to the drain of the transistor X221.

The terminal OUTA shown in FIG. 6 corresponds to the source of the transistor X222 shown in FIG. 7, and the terminal OUTB corresponds to the source of the transistor X221.

The terminal VB shown in FIG. 6 corresponds to the node to which the gate of the transistors X221 and X222 shown in FIG. 7 are mutually connected.

When the potential of the terminal OUTA is lower than the value VB−VT, which is the potential VB of the terminal VB reduced by the threshold voltage VT of the transistor X222, the drain-source of the transistor X222 becomes conductive, and is in a non-conductive state otherwise. Similarly, the state of the transistor X221 is changed by the potential of the terminal OUTB. Accordingly, the NchLIMITER 106 having the above-described functions is correctly realized through the circuit of FIG. 7.

As explained above, when the PchSW 103, the NchLIMITER 106, the NchLOAD 104 and the buffer 105 realized at the transistor level are connected in accordance with the topology shown in FIG. 6, the circuit of FIG. 7 is obtained.

Compared to the level converter shown in FIG. 2, with the level converter shown in FIG. 7 conversion to the output logic levels 0V/LV is accomplished at the first stage corresponding to the circuit block 30, so the circuit block 41 is unnecessary.

Consequently, in general the circuit of the level converter shown in FIG. 7 occupies less die area and consumes less power than the circuit of the level converter shown in FIG. 2.

In the above-described first and second embodiments, cases of application to a positive logic circuit were explained for simplicity. However, the above-described embodiments can also be applied to negative logic circuits.

In the above-described embodiments, the bulk of the high-voltage semiconductor process is composed of a P-channel semiconductor, and the case where this bulk is grounded to the lowest potential 0V in the circuit is assumed. In contrast, even when this bulk uses a high-voltage semiconductor process comprising an N-channel semiconductor, this bulk can comprise a level converter of opposite polarity by being connected to the highest potential in the circuit.

The level converter of the first embodiment is not limited to the circuits comprised as shown in FIGS. 1 and 4, and the level converter of the second embodiment is not limited to the circuits comprised as shown in FIGS. 2, 3, 5, 6 and 7.

Having described and illustrated the principles of this application by reference to one or more preferred embodiments, it should be apparent that the preferred embodiments may be modified in arrangement and detail without departing from the principles disclosed herein and that it is intended that the application be construed as including all such modifications and variations insofar as they come within the spirit and scope of the subject matter disclosed herein.

What is claimed is:

1. A level conversion circuit that converts a potential of a logic signal and outputting a logic signal with converted potential, comprising:
   a first circuit block composed of semiconductor elements and including a first signal input terminal, a first voltage terminal and a second voltage terminal, which when a first high-voltage logic signal in which two logical values are expressed by a first signal potential and a second signal potential is input into the first signal input terminal, converts the first high-voltage logic signal into a first low-voltage logic signal in which the two logical values are expressed by a third signal potential that is equal to or greater than the first signal potential, and a fourth signal potential that is greater than the third signal potential and is not greater than the second signal potential; and
   a second circuit block composed of semiconductor elements of opposite polarity to the first circuit block and including a second signal input terminal, a third voltage terminal and a fourth voltage terminal, which when the first high-voltage logic signal is input into the second signal input terminal, converts the first high-voltage logic signal into a low-voltage second logic signal in which the two logical values are expressed by the third signal potential and the fourth signal potential;
   wherein the first signal input terminal and the second signal input terminal are connected to each other;
   the third signal potential is applied to the first voltage terminal and the third voltage terminal;
   the fourth signal potential is applied to the second voltage terminal and the fourth voltage terminal; and
   the second logic signal is output from either the first circuit block or the second circuit block, depending on the value of the third signal potential.

2. The level conversion circuit according to claim 1, further comprising a third circuit block that converts a third logic signal in which the two logical values are expressed by the first signal potential and a fifth signal potential higher than the first signal potential yet lower than the second signal potential into the first logic signal and supplies this first logic signal to the first circuit block and the second circuit block.

3. The level conversion circuit according to claim 1, wherein:
the first circuit block is provided with:
an N-channel switch circuit composed of N-channel semiconductor elements and including a first signal input terminal, a first voltage terminal, a first connection terminal and a second connection terminal, such that when the bulk potential of the N-channel semiconductor elements is held at the first signal potential and the voltage of the first signal potential is applied to the first signal input terminal, the first voltage terminal and the first connection terminal are shorted each other and the second connection terminal is open, and when the voltage of the second signal potential is applied to the first signal input terminal, the first voltage terminal and the second connection terminal are shorted each other and the first connection terminal is open; and
a P-channel load circuit including a second voltage terminal, a third connection terminal and a fourth connection terminal, such that when one out of the third and fourth connection terminals is open and a voltage that is at least a fixed amount less than the potential of the second voltage terminal is applied to the other of the connection terminals, the potential of the connection terminal in the open state is equal to the potential of the second voltage terminal;
the second circuit block is provided with:
a P-channel switch circuit composed of P-channel semiconductor elements and including a second signal input terminal, a third voltage terminal, a fifth connection terminal and a sixth connection terminal, such that when the bulk potential of the P-channel semiconductor elements is held at a potential higher than the fourth signal potential and the voltage of the first signal potential is applied to the second signal input terminal the third voltage terminal and the fifth connection terminal are shorted each other and the sixth connection terminal is open, and when the voltage of the second signal potential is applied to the second signal input terminal, the third voltage terminal and the sixth connection terminal are shorted each other and the fifth connection terminal is open; and
an N-channel load circuit including a fourth voltage terminal, a seventh connection terminal and an eighth connection terminal, such that when one out of the seventh and eighth connection terminals is open and a voltage that is at least a fixed amount higher than the potential of the fourth voltage terminal is applied to the other of the connection terminals, the potential of the connection terminal in the open state is equal to the potential of the fourth voltage terminal;
the third connection terminal and the first connection terminal are connected by a first node;
the fourth connection terminal and the second connection terminal are connected by a second node;
the seventh connection terminal and the fifth connection terminal are connected by a third node;
the eighth connection terminal and the sixth connection terminal are connected by a fourth node;
the first node and the fourth node are connected to each other;
the second node and the third node are connected to each other;
the first logic signal is input into both the first and second signal input terminals; and
the second logic signal is output from either the first node or the second node.

4. The level conversion circuit according to claim 1, wherein:
the first circuit block is provided with a first transistor, a second transistor, a third transistor and a fourth transistor as transistors having current paths and control terminals, such that:
the fourth signal potential is applied to one end of the current path and the bulk of the first transistor, and to one end of the current path and the bulk of the third transistor;
the other end of the current path of the first transistor is connected to one end of the current path of the second transistor;
the other end of the current path of the third transistor is connected to one end of the current path of the fourth transistor;
the third signal potential is applied to the other end of the current path of the second transistor and the other end of the fourth transistor;
the first signal potential is applied to the bulk of the second transistor and the bulk of the fourth transistor; and
the connection point between the other end of the current path of the first transistor and the one end of the current path of the second transistor is called a first node, and the connection point between the other end of the current path of the third transistor and the one end of the current path of the fourth transistor is called a second node, the control terminal of the first transistor is connected to the second node and the control terminal of the third transistor is connected to the first node;
the second circuit block is provided with a fifth transistor, a sixth transistor, a seventh transistor and an eighth transistor as transistors having current paths and control terminals, such that:
the fourth signal potential is applied to one end of the current path of the fifth transistor and to one end of the current path of the seventh transistor;
the second signal potential is applied to the bulk of the fifth transistor and on the bulk of the seventh transistor;
the other end of the current path of the fifth transistor is connected to one end of the current path of the sixth transistor;
the other end of the current path of the seventh transistor is connected to one end of the current path of the eighth transistor;
the third signal potential is applied to the other end of the current path of the sixth transistor and the other end of the eighth transistor; and
the connection point between the other end of the current path of the fifth transistor and the one end of the current path of the sixth transistor is called a third node, and the connection point between the other end of the current path of the seventh transistor and the one end of the current path of the eighth transistor is called a fourth node, the control terminal of the sixth transistor is connected to the fourth node and the control terminal of the eighth transistor is connected to the third node;
the first node of the first circuit block and the third node of the second circuit block are connected, and the second node of the first circuit block and the fourth node of the second circuit block are connected;
the control terminal of the second transistor and the control terminal of the fifth transistor are connected, and the control terminal of the fourth transistor and the control terminal of the seventh transistor are connected; and
the first signal potential or the second signal potential is applied to the connection point between the control terminal of the second transistor and the control terminal of the fifth transistor, and to the connection point between the control terminal of the fourth transistor and the control terminal of the seventh transistor, and the second logic signal at the third signal potential or the fourth signal potential is output from the first node and the third node, or from the second node and the fourth node.

5. The level conversion circuit according to claim 4, wherein the first transistor, the third transistor, the fifth transistor and the seventh transistor are composed of PMOS transistors, and the second transistor, the fourth transistor, the sixth transistor and the eighth transistor are composed of NMOS transistors.

6. The level conversion circuit according to claim 4, wherein the first transistor and the third transistor are elements having substantially identical properties, and the fifth transistor and the seventh transistor are elements having substantially identical properties.

7. The level conversion circuit according to claim 4, further comprising a fourth circuit block that converts the second logic signal into a fourth logic signal in which the two logical values are expressed by the first signal potential and the fourth signal potential;
wherein the fourth circuit block is provided with a ninth transistor, a tenth transistor, an eleventh transistor, a twelfth transistor, a thirteenth transistor and a fourteenth transistor as transistors having current paths and control terminals, such that:
the fourth signal potential is applied to one end of the current path and the bulk of the ninth transistor;
one end of the current path of the tenth transistor is connected to the other end of the current path of the ninth transistor, and the third signal potential is applied to the other end and the bulk of the tenth transistor;
the control terminal of the ninth transistor, the control terminal of the tenth transistor and the control terminal of the eleventh transistor are connected;
the fourth signal potential is applied to one end of the current path of the eleventh transistor and one end of the current path of the twelfth transistor;
the second signal potential is applied to the bulk of the eleventh transistor and the bulk of the twelfth transistor;
the other end of the current path of the eleventh transistor is connected to one end of the current path of the fourteenth transistor;
the other end of the current path of the twelfth transistor is connected to one end of the current path of the thirteenth transistor;
the first signal potential is applied to the other end of the current path and the bulk of the thirteenth transistor and on the other end of the current path and the bulk of the fourteenth transistor;
the control terminal of the twelfth transistor is connected to the connection point between the other end of the current path of the ninth transistor and the one end of the current path of the tenth transistor;
the connection point between the other end of the current path of the twelfth transistor and the one end of the current path of the thirteenth transistor is a fifth node, and the connection point between the other end of the current path of the eleventh transistor and the one end of the current path of the fourteenth transistor is a sixth node;
the control terminal of the thirteenth transistor is connected to the sixth node and the control terminal of the fourteenth transistor is connected to the fifth node;

the second logic signal is supplied to the connection point between the control terminal of the ninth transistor, the control terminal of the tenth transistor and the control terminal of the eleventh transistor; and
the fourth logic signal at the first signal potential or the fourth signal potential is output from the fifth node or the sixth node.

8. The level conversion circuit according to claim 7, wherein the ninth transistor, the eleventh transistor and the twelfth transistor are composed of PMOS transistors, and the tenth transistor, the thirteenth transistor and the fourteenth transistor are composed of NMOS transistors.

9. The level conversion circuit according to claim 8, wherein the fourth circuit block further comprises a fifteenth transistor and a sixteenth transistor as transistors provided with current paths and control terminals, such that:
the fourth signal potential is applied to one end of the current path and the bulk of the fifteenth transistor and on one end of the current path and the bulk of the sixteenth transistor;
the other end of the current path of the fifteenth transistor is connected to one end of the current path of the twelfth transistor, and the other end of the current path of the sixteenth transistor is connected to one end of the current path of the eleventh transistor;
the third signal potential is applied to the control terminal of the eleventh transistor and the control terminal of the twelfth transistor, and
the control terminal of the fifteenth transistor is connected to the connection point between the control terminal of the ninth transistor and the control terminal of the tenth transistor, and the control terminal of the sixteenth transistor is connected to the connection point between the other end of the current path of the ninth transistor and the one end of the current path of the tenth transistor.

10. The level conversion circuit according to claim 8, further comprising a fifth circuit block that converts the fourth logic signal into a fifth logic signal in which the two logical values are expressed by the first signal potential and the fifth signal potential;
wherein the fifth circuit block is provided with a seventeenth transistor, an eighteenth transistor, a nineteenth transistor and a twentieth transistor as transistors having current paths and control terminals, such that:
the fifth signal potential is applied to one end of the current path and the bulk of the seventeenth transistor and one end of the current path and the bulk of the nineteenth transistor;
the other end of the current path of the seventeenth transistor is connected to one end of the current path of the eighteenth current path;
the other end of the current path of the nineteenth transistor is connected to one end of the current path of the twentieth transistor;
the first signal potential is applied to the other end of the current path and the bulk of the eighteenth transistor and on the other end of the current path and the bulk of the twentieth transistor;
the connection point between the other end of the current path of the seventeenth transistor and one end of the current path of the eighteenth transistor is called a seventh node, and the connection point between the other end of the current path of the nineteenth transistor and one end of the current path of the twentieth transistor is called an eighth node;

the control terminal of the seventeenth transistor is connected to the eighth node, and the control terminal of the nineteenth transistor is connected to the seventh node;
the fourth logic signal is supplied to the control terminal of the twentieth transistor and a signal equivalent to reversing the fourth logic signal is supplied to the control terminal of the eighteenth transistor; and
the fifth logic signal at the first signal potential or the fifth signal potential is output from the seventh node or the eighth node.

11. A level conversion circuit that converts and outputs a second logic signal in which two logical values are expressed by a third signal potential at least as great as a first signal potential and a fourth signal potential higher than the third potential into a third logic signal in which the two logical values are expressed by the first signal potential and a fifth signal potential higher than the first signal potential, said level conversion circuit comprising:
an N-channel switch circuit composed of N-channel semiconductor elements and including a first signal input terminal, a first voltage terminal, a first connection terminal and a second connection terminal, such that when the bulk potential of the N-channel semiconductor elements is held at the first signal potential and the voltage of the first signal potential is applied to the first signal input terminal, the first voltage terminal and the first connection terminal are shorted each other and the second connection terminal is open, and when the voltage of the fourth signal potential is applied to the first signal input terminal the first voltage terminal and the second connection terminal are shorted each other and the first connection terminal is open;
a P-channel switch circuit composed of P-channel semiconductor elements and including a second signal input terminal, a second voltage terminal, a third connection terminal and a fourth connection terminal, such that when the bulk potential of the P-channel semiconductor elements is held at a potential higher than the fourth signal potential and the voltage of the third signal potential is applied to the second signal input terminal the second voltage terminal and the third connection terminal are shorted each other and the fourth connection terminal is open, and when the voltage of the fourth signal potential is applied to the second signal input terminal the second voltage terminal and the fourth connection terminal are shorted each other and the third connection terminal is open;
an N-channel load circuit including a third voltage terminal, a fifth connection terminal and a sixth connection terminal, such that when one out of the fifth and sixth connection terminals is open and a voltage that is at least a fixed amount higher than the potential of the third voltage terminal is applied to the other of the connection terminals, the potential of the connection terminal in the open state is equal to the potential of the third voltage terminal; and
a P-channel load circuit including a fourth voltage terminal, a seventh connection terminal and an eighth connection terminal, such that when one out of the seventh and eighth connection terminals is open and a voltage that is at least a fixed amount less than the potential of the fourth voltage terminal is applied to the other of the connection terminals, the potential of the connection terminal in the open state is equal to the potential of the fourth voltage terminal;
wherein the first voltage terminal and the third voltage terminal are held at the first signal potential;
the second voltage terminal is held at the fourth signal potential;
the fourth voltage terminal is held at the fifth signal potential;
the fifth connection terminal and the third connection terminal are connected by a first node;
the sixth connection terminal and the fourth connection terminal are connected by a second node;
the seventh connection terminal and the first connection terminal are connected by a third node;
the eighth connection terminal and the second connection terminal are connected by a fourth node;
the first signal input terminal and the first node are connected;
the second logic signal is input into the second signal input terminal; and
the third logic signal is output from either the third node or the fourth node.

12. A level conversion circuit that converts and outputs a second logic signal in which two logical values are expressed by a third signal potential at least as great as a first signal potential and a fourth signal potential higher than the third potential into a third logic signal in which the two logical values are expressed by the first signal potential and a fifth signal potential higher than the first signal potential, said level conversion circuit comprising:
a P-channel switch circuit composed of P-channel semiconductor elements and including a signal input terminal, a first voltage terminal, a first connection terminal and a second connection terminal, such that when the bulk potential of the P-channel semiconductor elements is held at a potential higher than the fourth signal potential and the voltage of the third signal potential is applied to the signal input terminal, the first voltage terminal and the first connection terminal are shorted each other and the second connection terminal is open, and when the voltage of the fourth signal potential is applied to the signal input terminal, the first voltage terminal and the second connection terminal are shorted each other and the first connection terminal is open;
an N-channel load circuit including a second voltage terminal, a third connection terminal and a fourth connection terminal, such that when one out of the third and fourth connection terminals is open and a voltage that is at least a fixed amount higher than the potential of the second voltage terminal is applied to the other of the connection terminals, the potential of the connection terminal in the open state is equal to the potential of the second voltage terminal; and
an N-channel voltage limiting circuit composed of N-channel semiconductor elements and including a third voltage terminal, a fifth connection terminal, a sixth connection terminal, a seventh connection terminal and an eighth connection terminal, such that when the potential difference found by subtracting the potential of the seventh connection terminal from the potential of the third voltage terminal is larger than a predetermined threshold voltage, the fifth connection terminal and the seventh terminal are shorted, or are left open otherwise and when the potential difference found by subtracting the potential of the eighth connection terminal from the potential of the third voltage terminal is larger than this threshold voltage, the sixth connection terminal and the eighth connection terminal are shorted, or are left open otherwise;
wherein the first voltage terminal is held at the fourth signal potential, the second voltage terminal is held at the first signal potential, and a preset reference voltage that is a value at least as large as the fifth signal potential is applied to the third voltage terminal;

the first connection terminal and the fifth connection terminal are connected to each other;

the second connection terminal and the sixth connection terminal are connected to each other;

the third connection terminal and the seventh connection terminal are connected by a first node;

the fourth connection terminal and the eighth connection terminal are connected by a second node;

the second logic signal is input into the signal input terminal; and the third logic signal is output from either the first node or the second node.

\* \* \* \* \*